United States Patent
Noh et al.

(10) Patent No.: US 10,602,535 B2
(45) Date of Patent: Mar. 24, 2020

(54) METHOD AND APPARATUS FOR TRANSMITTING PBCH AND METHOD AND APPARATUS FOR RECEIVING PBCH

(71) Applicant: LG ELECTRONICS INC., Seoul (KR)

(72) Inventors: Kwangseok Noh, Seoul (KR); Bonghoe Kim, Seoul (KR); Jongwoong Shin, Seoul (KR); Hyunsoo Ko, Seoul (KR); Dongkyu Kim, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 16/247,842

(22) Filed: Jan. 15, 2019

(65) Prior Publication Data

US 2019/0166611 A1    May 30, 2019

Related U.S. Application Data

(63) Continuation of application No. PCT/KR2018/013919, filed on Nov. 14, 2018.

(60) Provisional application No. 62/593,221, filed on Nov. 30, 2017, provisional application No. 62/592,354, filed on Nov. 29, 2017, provisional application No.
(Continued)

(51) Int. Cl.
| | |
|---|---|
| *H04W 72/12* | (2009.01) |
| *H04W 72/00* | (2009.01) |
| *H03M 13/35* | (2006.01) |
| *H03M 13/13* | (2006.01) |
| *H03M 13/29* | (2006.01) |
| *H03M 13/09* | (2006.01) |
| *H04L 5/00* | (2006.01) |

(52) U.S. Cl.
CPC ....... *H04W 72/1273* (2013.01); *H03M 13/13* (2013.01); *H03M 13/2906* (2013.01); *H03M 13/35* (2013.01); *H04W 72/005* (2013.01); *H03M 13/09* (2013.01); *H04L 5/0007* (2013.01)

(58) Field of Classification Search
None
See application file for complete search history.

(56) References Cited

U.S. PATENT DOCUMENTS

| | | |
|---|---|---|
| 8,537,755 B2 | 9/2013 | Rasquinha |
| 2017/0288703 A1 | 10/2017 | Shen et al. |

(Continued)

FOREIGN PATENT DOCUMENTS

| | | |
|---|---|---|
| KR | 1020140077492 | 6/2014 |
| KR | 1020170097190 | 8/2017 |
| WO | WO2017127973 | 8/2017 |

OTHER PUBLICATIONS

NTT Docomo, Inc., "Discussion on NR-PBCH contents and payload size," R1-1713897, 3GPP TSG RAN WG1 Meeting #90, Prague, Czech Republic, Aug. 21-25, 2017, 7 pages.

(Continued)

*Primary Examiner* — Huy D Vu
*Assistant Examiner* — Bao G Nguyen
(74) *Attorney, Agent, or Firm* — Fish & Richardson P.C.

(57) ABSTRACT

In a wireless communication system, a physical broadcast channel (PBCH) is encoded based on a Polar code and then is transmitted. Half-frame information within the PBCH is mapped to a bit position 247 among bit positions of the Polar code and synchronization signal and PBCH block (SSB) index information within the PBCH is mapped to bit positions 253, 254, and 255 of the Polar code.

15 Claims, 16 Drawing Sheets

Related U.S. Application Data

62/591,763, filed on Nov. 28, 2017, provisional application No. 62/587,451, filed on Nov. 16, 2017.

(56) References Cited

U.S. PATENT DOCUMENTS

2018/0198555 A1* 7/2018 Wu ................... H04L 1/0009
2019/0104502 A1* 4/2019 Wu ................... H04W 72/005

OTHER PUBLICATIONS

Huawei, HiSilicon, "Polar code for PBCH and soft combining," R1-1715499, 3GPP TSG RAN WG1 Meeting NR#3, Nagoya, Japan, Sep. 18-21, 2017, 13 pages.

Huawei, HiSilicon, "Polar code for PBCH and soft combining," R1-1718373, 3GPP TSG RAN WG1 Meeting 90bis, Prague, Czech Republic, Oct. 9-13, 2017, 13 pages.

MediaTek Inc., "PBCH Coding Design," R1-1718894, 3GPP TSG RAN WG1 RAN1 Meeting #90-Bis, Prague, Czech, Oct. 9-13, 2017, 10 pages.

Ericsson, Qualcomm, "WF on Polar Code Construction for NR PBCH," R1-1718959, 3GPP TSG RAN WG1 Meeting 90bis, Prague, CZ, Oct. 9-13, 2017, 7 pages.

MediaTek Inc., "PBCH Coding Design," R1-1718345, 3GPP TSG RAN WG1 RAN1 Meeting #90-Bis, Prague, Czech, Oct. 9-13, 2017, 10 pages.

CATT, "Discussion on order and mapping of PBCH fields," R1-1720213, 3GPP TSG RAN WG1 Meeting #91, Reno, USA, Nov. 27-Dec. 1, 2017, 3 pages.

\* cited by examiner

☐ : systematic bit  ▦ : RV point
▨ : Parity 0  ▧ : Parity 1

(a)  (b)

(a)

(b)

METHOD AND APPARATUS FOR TRANSMITTING PBCH AND METHOD AND APPARATUS FOR RECEIVING PBCH

CLAIM OF PRIORITY

This application is a continuation application of PCT International Application No. PCT/KR2018/013919, filed on Nov. 14, 2018, which claims the benefit of U.S. Provisional Application No. 62/587,451, filed on Nov. 16, 2017; 62/591,763, filed on Nov. 28, 2017; 62/592,354, filed on Nov. 29, 2017; and 62/593,221, filed on Nov. 30, 2017, which are all hereby incorporated by reference herein in their entirety.

TECHNICAL FIELD

The present invention relates to a wireless communication system, and more particularly, to a method and apparatus for transmitting/receiving a physical broadcast channel (PBCH).

BACKGROUND ART

With appearance and spread of machine-to-machine (M2M) communication, machine type communication (MTC) and a variety of devices such as smartphones and tablet Personal Computers (PCs) and technology demanding a large amount of data transmission, data throughput needed in a cellular network has rapidly increased. To satisfy such rapidly increasing data throughput, carrier aggregation technology, cognitive radio technology, etc. for efficiently employing more frequency bands and multiple input multiple output (MIMO) technology, multi-base station (BS) cooperation technology, etc. for raising data capacity transmitted on limited frequency resources have been developed.

As more communication devices have demanded higher communication capacity, there has been necessity of enhanced mobile broadband (eMBB) relative to legacy radio access technology (RAT). In addition, massive machine type communication (mMTC) for providing various services anytime and anywhere by connecting a plurality of devices and objects to each other is one main issue to be considered in future-generation communication.

Further, a communication system to be designed in consideration of services/UEs sensitive to reliability and latency is under discussion. The introduction of future-generation RAT has been discussed by taking into consideration eMBB communication, mMTC, ultra-reliable and low-latency communication (URLLC), and the like.

DISCLOSURE

Technical Problem

Due to introduction of new radio communication technology, the number of user equipments (UEs) to which a BS should provide a service in a prescribed resource region increases and the amount of data and control information that the BS should transmit to the UEs increases. Since the amount of resources available to the BS for communication with the UE(s) is limited, a new method in which the BS efficiently receives/transmits uplink/downlink data and/or uplink/downlink control information using the limited radio resources is needed. In other words, as the density of nodes and/or the density of UEs increases, a method of efficiently using high-density nodes or high-density UEs for communication is needed.

With development of technologies, overcoming delay or latency has become an important challenge. Applications whose performance critically depends on delay/latency are increasing. Accordingly, a method to reduce delay/latency compared to the legacy system is demanded.

In a new communication system, use of Polar codes is considered to improve channel coding performance. The size of Polar codes is generally much greater than that of other codes used for channel coding. Therefore, when Polar codes are used for channel coding, a method of improving a decoding speed of Polar codes is needed.

The technical objects that can be achieved through the present invention are not limited to what has been particularly described hereinabove and other technical objects not described herein will be more clearly understood by persons skilled in the art from the following detailed description.

Technical Solution

In an aspect of the present invention, provided herein is a method of transmitting a physical broadcast channel (PBCH) by a transmitting device in a wireless communication system. The method comprises: mapping information within the PBCH to bit positions of a Polar code of size N=512, based on a Polar sequence; encoding the information based on the Polar code; and transmitting the PBCH including the information. The information includes half-frame information and synchronization signal and PBCH block (SSB) index information. The half-frame information is 1 bit and is mapped to a bit position 247 among bit positions 0 to 511 of the Polar code. The SSB index information is 3 bits and is mapped to bit positions 253, 254, and 255 of the Polar code.

In another aspect of the present invention, provided herein is a method of receiving a physical broadcast channel (PBCH) by a receiving device in a wireless communication system. The method comprises: receiving the PBCH; and decoding information within the PBCH based on a Polar code of size N=512. The information is decoded based on a mapping relationship between the information and bit positions of the Polar code. The information includes half-frame information and synchronization signal and PBCH block (SSB) index information. The half-frame information is one bit and the SSB index information is 3 bits. The mapping relationship includes: mapping the half-frame information to a bit position 247 among bit positions 0 to 511 of the Polar code, and mapping the SSB index information to bit positions 253, 254, and 255 of the Polar code.

In a further aspect of the present invention, provided herein is a transmitting device for transmitting a physical broadcast channel (PBCH) in a wireless communication system. The transmitting device comprises a transceiver, and a processor operably connected to the transceiver. The processor is configured to: map information within the PBCH to bit positions of a Polar code of size N=512, based on a Polar sequence; encode the information based on the Polar code; and control the transceiver to transmit the PBCH including the information. The information includes half-frame information and synchronization signal and PBCH block (SSB) index information. The half-frame information is one bit and the processor is configured to map the half-frame information to a bit position 247 among bit positions 0 to 511 of the Polar code. The SSB index information is 3 bits and the processor is configured to map the SSB index information to bit positions 253, 254, and 255 of the Polar code.

In a still further aspect of the present invention, provided herein is receiving device for receiving a physical broadcast channel (PBCH) in a wireless communication system. The transmitting device comprises: a transceiver, and a processor operably connected to the transceiver. The processor is configured to: control the transceiver to receive the PBCH; and decode information within the PBCH based on a Polar code of size N=512. The information is decoded based on a mapping relationship between the information and bit positions of the Polar code. The information includes half-frame information and synchronization signal and PBCH block (SSB) index information. The half-frame information is one bit and the SSB index information is 3 bits. The mapping relationship includes: mapping the half-frame information to a bit position 247 among bit positions 0 to 511 of the Polar code, and mapping the SSB index information to bit positions 253, 254, and 255 of the Polar code.

In each aspect of the present invention, a total payload size of the PBCH including the information may be 56 bits.

In each aspect of the present invention, the Polar sequence may include a sequence arranging bit indexes 0 to 511 corresponding one by one to the bit positions 0 to 511 of the Polar code in ascending order of reliability.

In each aspect of the present invention, the information may include a system frame number for a frame to which the PBCH belongs. In each aspect of the present invention, the second and third least significant bits of the system frame number may be mapped to bit positions 441 and 469 of the Polar code, respectively. In each aspect of the present invention, the other 8 bits of the system frame number may be mapped to bit positions 367, 375, 415, 444, 470, 473, 483 and 485 of the Polar code.

The above technical solutions are merely some parts of the examples of the present invention and various examples into which the technical features of the present invention are incorporated can be derived and understood by persons skilled in the art from the following detailed description of the present invention.

Advantageous Effects

According to example(s) of the present invention, uplink/downlink signals can be efficiently transmitted/received. Therefore, overall throughput of a radio communication system can be improved.

According to example(s) of the present invention, delay/latency occurring during communication between a user equipment and a base station may be reduced.

According to example(s) of the present invention, decoding speed can be improved when Polar codes are used for channel coding.

According to example(s) of the present invention, a block error rate (BLER) can be improved by allocating a specific bit to a specific bit position of Polar codes.

It will be appreciated by persons skilled in the art that that the effects that can be achieved through the present invention are not limited to what has been particularly described hereinabove and other advantages of the present invention will be more clearly understood from the following detailed description.

BRIEF DESCRIPTION OF THE DRAWINGS

The accompanying drawings, which are included to provide a further understanding of the invention, illustrate examples of the invention and together with the description serve to explain the principle of the invention.

MODE FOR CARRYING OUT THE INVENTION

Figure 1:
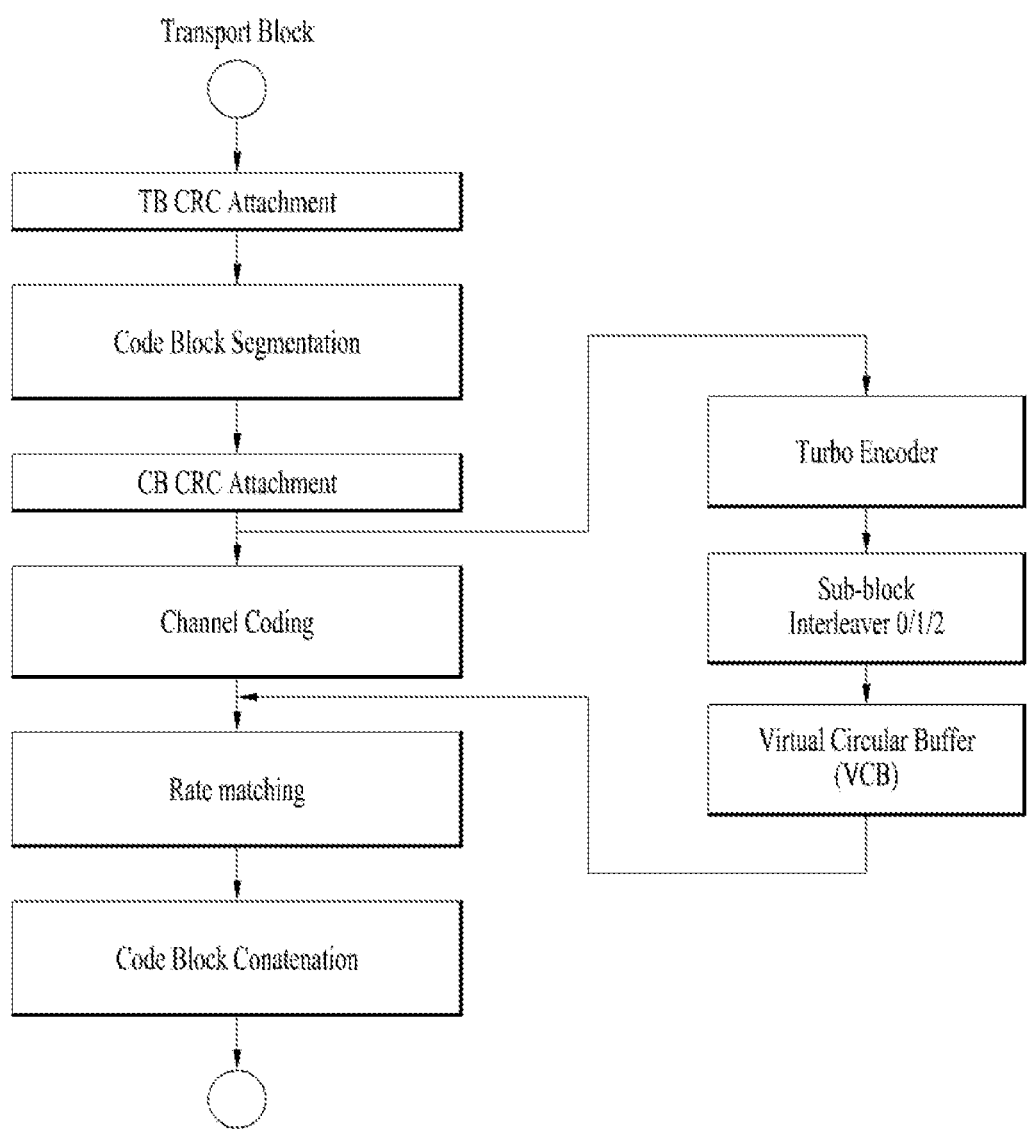
FIG. 1 illustrates a transport block processing procedure in an LTE/LTE-A system.

Reference will now be made in detail to the exemplary examples of the present invention, examples of which are illustrated in the accompanying drawings. The detailed description, which will be given below with reference to the accompanying drawings, is intended to explain exemplary examples of the present invention, rather than to show the only examples that can be implemented according to the invention. The following detailed description includes specific details in order to provide a thorough understanding of the present invention. However, it will be apparent to those skilled in the art that the present invention may be practiced without such specific details.

In some instances, known structures and devices are omitted or are shown in block diagram form, focusing on important features of the structures and devices, so as not to obscure the concept of the present invention. The same reference numbers will be used throughout this specification to refer to the same or like parts.

The following techniques, apparatuses, and systems may be applied to a variety of wireless multiple access systems. Examples of the multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multicarrier frequency division multiple access (MC-FDMA) system. CDMA may be embodied through radio technology such as universal terrestrial radio access (UTRA) or CDMA2000. TDMA may be embodied through radio technology such as global system for mobile communications (GSM), general packet radio service (GPRS), or enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802.20, or evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in DL and SC-FDMA in UL. LTE-advanced (LTE-A) is an evolved version of 3GPP LTE. For convenience of description, it is assumed that the present invention is applied to 3GPP based communication system, e.g. LTE/LTE-A, NR. However, the technical features of the present invention are not limited thereto. For example, although the following detailed description is given based on a mobile communication system corresponding to a 3GPP LTE/LTE-A/NR system, aspects of the present invention that are not specific to 3GPP LTE/LTE-A/NR are applicable to other mobile communication systems.

In examples of the present invention described below, the expression that a device "assumes" may mean that a subject which transmits a channel transmits the channel in accordance with the corresponding "assumption". This may also mean that a subject which receives the channel receives or decodes the channel in a form conforming to the "assumption", on the assumption that the channel has been transmitted according to the "assumption".

In the present invention, a user equipment (UE) may be a fixed or mobile device. Examples of the UE include various devices that transmit and receive user data and/or various kinds of control information to and from a base station (BS). The UE may be referred to as a terminal equipment (TE), a mobile station (MS), a mobile terminal (MT), a user terminal (UT), a subscriber station (SS), a wireless device, a personal digital assistant (PDA), a wireless modem, a handheld device, etc. In addition, in the present invention, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB), a base transceiver system (BTS), an access point (AP), a processing server (PS), etc. Particularly, a BS of a UTRAN is referred to as a Node-B, a BS of an E-UTRAN is referred to as an eNB, and a BS of a new radio access technology network is referred to as an gNB. Herein, for convenience of description, a base station will be referred to as a BS regardless of type or version of communication technology.

In the present invention, a node refers to a fixed point capable of transmitting/receiving a radio signal through communication with a UE. Various types of BSs may be used as nodes irrespective of the terms thereof. For example, a BS, a node B (NB), an e-node B (eNB), a pico-cell eNB (PeNB), a home eNB (HeNB), a relay, a repeater, etc. may be a node. In addition, the node may not be a BS. For example, the node may be a radio remote head (RRH) or a radio remote unit (RRU). The RRH or RRU generally has a lower power level than a power level of a BS. Since the RRH or RRU (hereinafter, RRH/RRU) is generally connected to the BS through a dedicated line such as an optical cable, cooperative communication between RRH/RRU and the BS can be smoothly performed in comparison with cooperative communication between BSs connected by a radio line. At least one antenna is installed per node. The antenna may mean a physical antenna or mean an antenna port or a virtual antenna.

In the present invention, a cell refers to a prescribed geographical area to which one or more nodes provide a communication service. Accordingly, in the present invention, communicating with a specific cell may mean communicating with a BS or a node which provides a communication service to the specific cell. In addition, a DL/UL signal of a specific cell refers to a DL/UL signal from/to a BS or a node which provides a communication service to the specific cell. A node providing UL/DL communication services to a UE is called a serving node and a cell to which UL/DL communication services are provided by the serving node is especially called a serving cell. Furthermore, channel status/quality of a specific cell refers to channel status/quality of a channel or communication link formed between a BS or node which provides a communication service to the specific cell and a UE. In the 3GPP based communication system, the UE may measure DL channel state received from a specific node using cell-specific reference signal(s) (CRS(s)) transmitted on a CRS resource and/or channel state information reference signal(s) (CSI-RS(s)) transmitted on a CSI-RS resource, allocated by antenna port(s) of the specific node to the specific node.

Meanwhile, a 3GPP based communication system uses the concept of a cell in order to manage radio resources and a cell associated with the radio resources is distinguished from a cell of a geographic region.

A "cell" of a geographic region may be understood as coverage within which a node can provide service using a carrier and a "cell" of a radio resource is associated with bandwidth (BW) which is a frequency range configured by the carrier. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of a radio resource used by the node. Accordingly, the term "cell" may be used to indicate service coverage of the node sometimes, a radio resource at other times, or a range that a signal using a radio resource can reach with valid strength at other times.

Meanwhile, the 3GPP communication standards use the concept of a cell to manage radio resources. The "cell" associated with the radio resources is defined by combination of downlink resources and uplink resources, that is, combination of DL CC and UL CC. The cell may be configured by downlink resources only, or may be configured by downlink resources and uplink resources. If carrier aggregation is supported, linkage between a carrier frequency of the downlink resources (or DL CC) and a carrier frequency of the uplink resources (or UL CC) may be indicated by system information. For example, combination of the DL resources and the UL resources may be indicated by linkage of system information block type 2 (SIB2). The carrier frequency may be the same as a center frequency of each cell or CC. A cell operating on a primary frequency may be referred to as a primary cell (Pcell) or PCC, and a cell operating on a secondary frequency may be referred to as a secondary cell (Scell) or SCC. The carrier corresponding to the Pcell on downlink will be referred to as a downlink primary CC (DL PCC), and the carrier corresponding to the Pcell on uplink will be referred to as an uplink primary CC (UL PCC). A Scell means a cell that may be configured after completion of radio resource control (RRC) connection establishment and used to provide additional radio resources. The Scell may form a set of serving cells for the UE together with the Pcell in accordance with capabilities of the UE. The carrier corresponding to the Scell on the downlink will be referred to as downlink secondary CC (DL SCC), and the carrier corresponding to the Scell on the uplink will be referred to as uplink secondary CC (UL SCC). Although the UE is in RRC-CONNECTED state, if it is not configured by carrier aggregation or does not support carrier aggregation, a single serving cell configured by the Pcell only exists.

3GPP based communication standards define DL physical channels corresponding to resource elements carrying information derived from a higher layer and DL physical signals corresponding to resource elements which are used by a physical layer but which do not carry information derived from a higher layer. For example, a physical downlink shared channel (PDSCH), a physical broadcast channel (PBCH), a physical multicast channel (PMCH), a physical control format indicator channel (PCFICH), a physical downlink control channel (PDCCH), and a physical hybrid ARQ indicator channel (PHICH) are defined as the DL physical channels, and a reference signal and a synchronization signal are defined as the DL physical signals. A reference signal (RS), also called a pilot, refers to a special waveform of a predefined signal known to both a BS and a UE. For example, a cell-specific RS (CRS), a UE-specific RS (UE-RS), a positioning RS (PRS), and channel state information RS (CSI-RS) may be defined as DL RSs. Meanwhile, the 3GPP based communication standards define UL physical channels corresponding to resource elements carrying information derived from a higher layer and UL physical signals corresponding to resource elements which are used by a physical layer but which do not carry information derived from a higher layer. For example, a physical uplink shared channel (PUSCH), a physical uplink control channel (PUCCH), and a physical random access channel (PRACH) are defined as the UL physical channels, and a demodulation reference signal (DM RS) for a UL control/data signal and a sounding reference signal (SRS) used for UL channel measurement are defined as the UL physical signals.

In the present invention, a physical downlink control channel (PDCCH), a physical control format indicator channel (PCFICH), a physical hybrid automatic retransmit request indicator channel (PHICH), and a physical downlink shared channel (PDSCH) refer to a set of time-frequency resources or resource elements (REs) carrying downlink control information (DCI), a set of time-frequency resources or REs carrying a control format indicator (CFI), a set of time-frequency resources or REs carrying downlink acknowledgement (ACK)/negative ACK (NACK), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively. In the present invention, in particular, a time-frequency resource or RE that is assigned to or belongs to PDCCH/PCFICH/PHICH/PDSCH/PUCCH/PUSCH/PRACH is referred to as PDCCH/PCFICH/PHICH/PDSCH/PUCCH/PUSCH/PRACH RE or PDCCH/PCFICH/PHICH/PDSCH/PUCCH/PUSCH/PRACH time-frequency resource, respectively. Therefore, in the present invention, PUCCH/PUSCH/PRACH transmission of a UE is conceptually identical to UCI/uplink data/random access signal transmission on PUSCH/PUCCH/PRACH, respectively. In addition, PDCCH/PCFICH/PHICH/PDSCH transmission of a BS is conceptually identical to downlink data/DCI transmission on PDCCH/PCFICH/PHICH/PDSCH, respectively.

For terms and technologies which are not described in detail in the present invention, reference can be made to the standard document of 3GPP LTE/LTE-A, for example, 3GPP TS 36.211, 3GPP TS 36.212, 3GPP TS 36.213, 3GPP TS 36.321, and 3GPP TS 36.331 and the standard document of 3GPP NR, for example, 3GPP TS 38.211, 3GPP TS 38.212, 3GPP TS 38.213, 3GPP TS 38.214, 3GPP TS 38.300 and 3GPP TS 38.331. In addition, as to polar codes and the principle of encoding and decoding using the polar codes, reference may be made to 'E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009'.

As more communication devices have demanded higher communication capacity, there has been necessity of enhanced mobile broadband relative to legacy radio access technology (RAT). In addition, massive machine type communication for providing various services irrespective of time and place by connecting a plurality of devices and objects to each other is one main issue to be considered in future-generation communication. Further, a communication system design in which services/UEs sensitive to reliability and latency are considered is under discussion. The introduction of future-generation RAT has been discussed by taking into consideration enhanced mobile broadband communication, massive MTC, ultra-reliable and low-latency communication (URLLC), and the like. In current 3GPP, a study of the future-generation mobile communication system after EPC is being conducted. In the present invention, the corresponding technology is referred to as a new RAT (NR) or 5G RAT, for convenience.

An NR communication system demands that much better performance than a legacy fourth generation (4G) system be supported in terms of data rate, capacity, latency, energy consumption, and cost. Accordingly, the NR system needs to make progress in terms of bandwidth, spectrum, energy, signaling efficiency, and cost per bit. NR needs to use efficient waveforms in order to satisfy these requirements.

FIG. 1 illustrates a transport block processing procedure in an LTE/LTE-A system.

In order for a receiving side to correct errors that signals experience in a channel, a transmitting side encodes information using a forward error correction code and then transmits the encoded information. The receiving side demodulates a received signal and decodes the error correction code to thereby recover the information transmitted by the transmitting side. In this decoding procedure, errors in the received signal caused by a channel are corrected.

Data arrives at a coding block in the form of a maximum of two transport blocks every transmission time interval (TTI) in each DL/UL cell. The following coding steps may be applied to each transport block of the DL/UL cell:

cyclic redundancy check (CRC) attachment to a transport block;
code block segmentation and CRC attachment to a code block;
channel coding;
rate matching; and
code block concatenation.

Although various types of error correction codes are available, a turbo code has mainly been used in a legacy LTE/LTE-A system. The turbo code is implemented by a recursive systematic convolution encoder and an interleaver. For actual implementation of the turbo code, an interleaver is used to facilitate parallel decoding and quadratic polynomial permutation (QPP) is a kind of interleaving. It is known that a QPP interleaver maintains good performance only for a data block of a specific size. It is known that performance of the turbo code increases with a larger data block size. In an actual communication system, a data block of a predetermined size or larger is divided into a plurality of smaller data blocks and then is encoded, to facilitate actual implementation of coding. The smaller data blocks are called code blocks. While the code blocks are generally of the same size, one of the code blocks may have a different size due to a limited size of the QPP interleaver. Error correction coding is performed on each code block of a predetermined interleaver size and then interleaving is performed to reduce the impact of burst errors that are generated during transmission over a radio channel. The error-corrected and interleaved code block is transmitted by being mapped to an actual radio resource. The amount of radio resources used for actual transmission is designated. Thus, the encoded code blocks are rate-matched to the amount of the radio resources. In general, rate matching is performed through puncturing or repetition. For example, if the amount of radio resources, i.e., the number of transmission bits capable of being transmitted on the radio resources, is M and if a coded bit sequence, i.e., the number of output bits of the encoder, is N, in which M is different from N, then rate matching is performed to match the length of the coded bit sequence to M. If M>N, then all or a part of bits of the coded bit sequence are repeated to match the length of the rate-matched sequence to M. If M<N, then a part of the bits of the coded bit sequence is punctured to match the length of the rate-matched sequence to M and the punctured bits are excluded from transmission.

Namely, in an LTE/LTE-A system, after data to be transmitted is encoded using channel coding having a specific code rate (e.g., 1/3), the code rate of the data to be transmitted is adjusted through a rate-matching procedure consisting of puncturing and repetition. When the turbo code is used as a channel code in the LTE/LTE-A system, a procedure of performing channel coding and rate-matching on each code block in the transport block processing procedure as illustrated in FIG. 1 is illustrated in FIG. 2.

Figure 2:
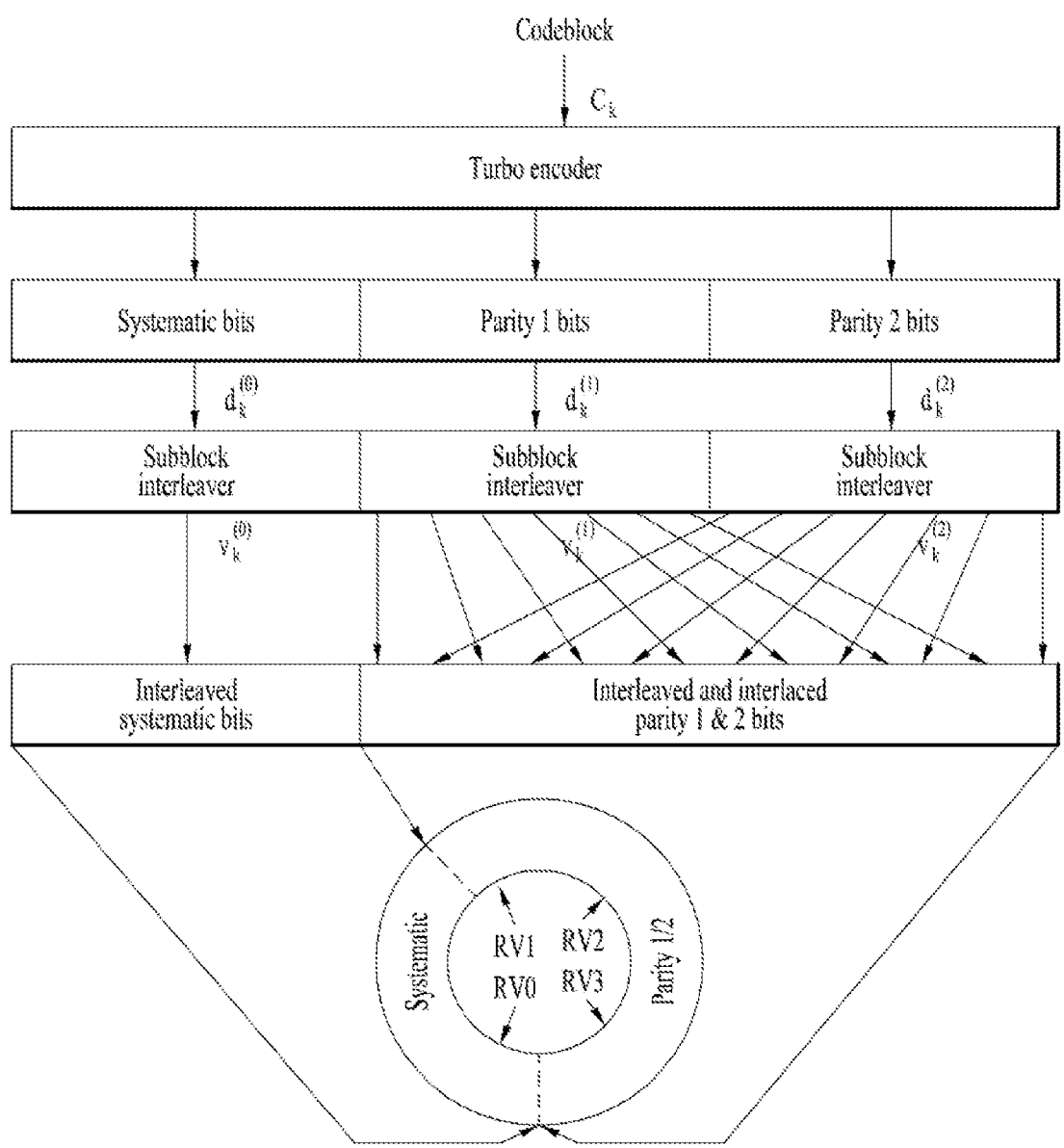
FIG. 2 is a block diagram illustrating rate matching performed by separating an encoded code block into a systematic part and a parity part.

FIG. 2 is a block diagram illustrating rate matching performed by separating an encoded code block into a systematic part and a parity part.

As illustrated in FIG. 2, the mother code rate of an LTE/LTE-A turbo encoder is 1/3. In order to obtain other code rates, if necessary, repetition or puncturing has to be performed, which are performed by a rate matching module. The rate matching module consists of three so-called sub-block interleavers for three output streams of the turbo encoder and a bit selection and pruning part, which is realized by a circular buffer. The sub-block interleaver is based on a classic row-column interleaver with 32 rows and length-32 intra-column permutation. The bits of each of the three streams are written row-by-row into a matrix with 32 columns (number of rows depends on stream size). Dummy bits are padded to the front of each stream to completely fill the matrix. After column permutation, bits are read out from the matrix column-by-column.

Figure 3:
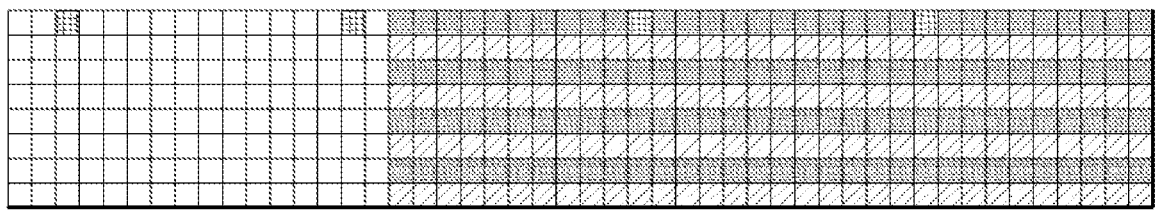
FIG. 3 illustrates an internal structure of a circular buffer.

FIG. 3 illustrates an internal structure of a circular buffer.

The circular buffer is the most important part of the rate matching module, making it possible to perform puncturing and repetition of a mother code. Referring to FIG. 2, the interleaved systematic bits are written into the circular buffer in sequence, with the first bit of the interleaved systematic bit stream at the beginning of the buffer. The interleaved and interlaced parity bit streams are written into the buffer in sequence, with the first bit of the stream next to the last bit of the interleaved systematic bit stream. Coded bits (depending on code rate) are read out serially from a certain starting point specified by redundancy version (RV) points in the circular buffer. If the coded bits reaches the end of the circular buffer and more coded bits are needed for transmission (in the case of a code rate smaller than 1/3), a transmitting device wraps around and continues at the beginning of the circular buffer.

HARQ, which stands for Hybrid ARQ, is an error correction mechanism based on retransmission of packets, which are detected with errors. The transmitted packet arrives at a receiving device after a certain propagation delay. The receiving device produces ACK for the case of error-free transmission or NACK for the case of detection of some errors. ACK/NACK is produced after some processing time and sent back to the transmitting device and arrives at the transmitting device after a propagation delay. In the case of NACK, after a certain processing delay in the transmitting device, a desired packet will be sent again. Bits, which are read out from the circular buffer and sent through retransmission, are different and depend on the position of the RV. There are four RVs (0, 1, 2, and 3), which define the position of a starting point at which the bits are read out from the circular buffer. Referring to FIG. 3, with the progressing number of retransmissions, the RV becomes higher and therefore fewer systematic bits and more parity bits are read out from the circular buffer for retransmission.

NR provides higher speeds and better coverage than current 4G. NR operates in a high frequency band and is required to offer speeds of up to 1 Gb/s for tens of connections or tens of Mb/s for tens of thousands of connections. To meet requirements of such an NR system, introduction of a more evolved coding scheme than a legacy coding scheme is under discussion. Since data communication arises in an incomplete channel environment, channel coding plays an important role in achieving a higher data rate for fast and error-free communication. A selected channel code needs to provide superior block error ratio (BLER) performance for block lengths and code rates of a specific range. Herein, BLER is defined as the ratio of the number of erroneous received blocks to the total number of sent blocks. In NR, low calculation complexity, low latency, low cost, and higher flexibility are demanded for a coding scheme. Furthermore, reduced energy per bit and improved region efficiency are needed to support a higher data rate. Use examples for NR networks are enhanced mobile broadband (eMBB), massive Internet of things (IoT), and ultra-reliable and low latency communication (URLLC). eMBB covers Internet access with high data rates to enable rich media applications, cloud storage and applications, and augmented reality for entertainment. Massive IoT applications include dense sensor networks for smart homes/buildings, remote health monitoring, and logistics tracking. URLLC covers critical applications that demand ultra-high reliability and low latency, such as industrial automation, driverless vehicles, remote surgery, and smart grids.

Although many coding schemes with high capacity performance at large block lengths are available, many of these coding schemes do not consistently exhibit excellent good performance in a wide range of block lengths and code rates. However, turbo codes, low-density parity check (LPDC) codes, and polar codes show promising BLER performance in a wide range of coding rates and code lengths and hence are considered to be used in the NR system. As demand for various cases such as eMBB, massive IoT, and URLLC has increased, a coding scheme providing greater channel coding efficiency than in turbo codes is needed. In addition, increase in a maximum number of subscribers capable of being accommodated by a channel, i.e., increase in capacity, has been required.

Polar codes are codes providing a new framework capable of solving problems of legacy channel codes and were invented by Arikan at Bilkent University (reference: E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009). Polar codes are the first capacity-achieving codes with low encoding and decoding complexities, which were proven mathematically. Polar codes outperform the turbo codes in large block lengths while no error flow is present. Hereinafter, channel coding using the polar codes is referred to as polar coding.

Polar codes are known as codes capable of achieving the capacity of a given binary discrete memoryless channel. This can be achieved only when a block size is sufficiently large. That is, polar codes are codes capable of achieving the capacity of a channel if the size N of the codes infinitely increases. Polar codes have low encoding and decoding complexity and may be successfully decoded. Polar codes are a sort of linear block error correction codes. Multiple recursive concatenations are basic building blocks for the polar codes and are bases for code construction. Physical conversion of channels in which physical channels are converted into virtual channels occurs and such conversion is based on a plurality of recursive concatenations. If multiple channels are multiplied and accumulated, most of the channels may become better or worse. The idea underlying polar codes is to use good channels. For example, data is sent through good channels at rate 1 and data is sent through bad channels at rate 0. That is, through channel polarization, channels enter a polarized state from a normal state.

Figure 4:
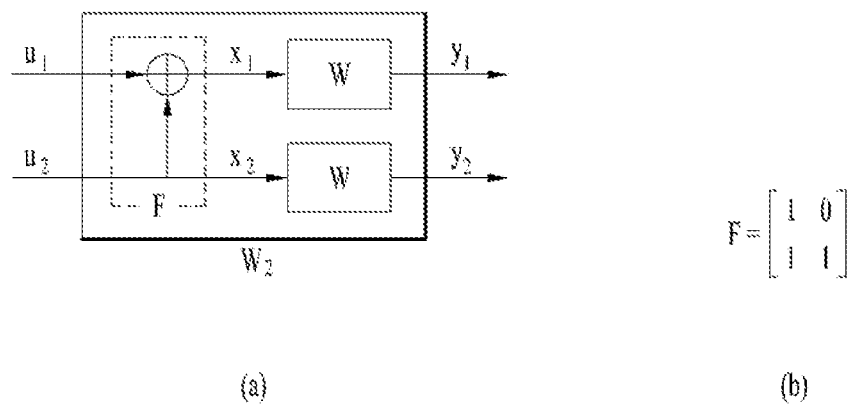
FIG. 4 is a block diagram for a polar code encoder.

FIG. 4 is a block diagram for a polar code encoder.

FIG. 4(a) illustrates a base module of a polar code, particularly, first level channel combining for polar coding. In FIG. 4(a), $W_2$ denotes an entire equivalent channel obtained by combining two binary-input discrete memoryless channels (B-DMCs), Ws. Herein, $u_1$ and $u_2$ are binary-input source bits and $y_1$ and $y_2$ are output coded bits. Channel combining is a procedure of concatenating the B-DMCs in parallel.

FIG. 4(b) illustrates a base matrix F for the base module. The binary-input source bits $u_1$ and $u_2$ input to the base matrix F and the output coded bits $x_1$ and $x_2$ of the base matrix F have the following relationship.

$$[u_1 \ u_2]\begin{bmatrix} 1 & 0 \\ 1 & 1 \end{bmatrix} = [x_1 \ x_2] \quad \text{Equation 1}$$

The channel $W_2$ may achieve symmetric capacity I(W) which is a highest rate. In the B-DMC W, symmetric capacity is an important parameter which is used to measure a rate and is a highest rate at which reliable communication can occur over the channel W. The B-DMC may be defined as follows.

$$I(W) = \sum_{y \in Y} \sum_{x \in X} \frac{1}{2} W(y|x) \log \frac{w(y|x)}{\frac{1}{2}w(y|0) + \frac{1}{2}w(y|1)} \quad \text{Equation 2}$$

It is possible to synthesize or create a second set of N binary input channels out of N independent copies of a given B-DMC W and the channels have the properties $\{W_N^{(i)}: 1 \leq i \leq N\}$. If N increases, there is a tendency for a part of the channels to have capacity approximating to 1 and for the remaining channels to have capacity approximating to 0. This is called channel polarization. In other words, channel polarization is a process of creating a second set of N channels $\{W_N^{(i)}: 1 \leq i \leq N\}$ using N independent copies of a given B-DMC W. The effect of channel polarization means that, when N increases, all symmetric capacity terms $\{I(W_N^{(i)})\}$ tend towards 0 or 1 for all except a vanishing fraction of indexes i. In other words, the concept behind channel polarization in the polar codes is transforming N copies (i.e., N transmissions) of a channel having a symmetric capacity of I(W) (e.g., additive white Gaussian noise channel) into extreme channels of capacity close to 1 or 0. Among the N channels, an I(W) fraction will be perfect channels and an 1−I(W) fraction will be completely noise channels. Then, information bits are transmitted only through good channels and bits input to the other channels are frozen to 1 or 0. The amount of channel polarization increases along with a block length. Channel polarization consists of two phases: channel combining phase and channel splitting phase.

Figure 5:
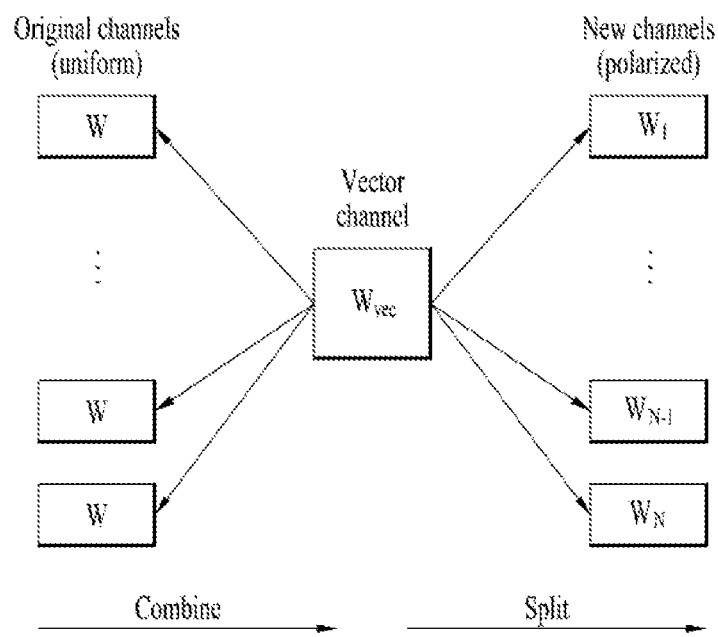
FIG. 5 illustrates the concept of channel combining and channel splitting for channel polarization.
Figure 5:
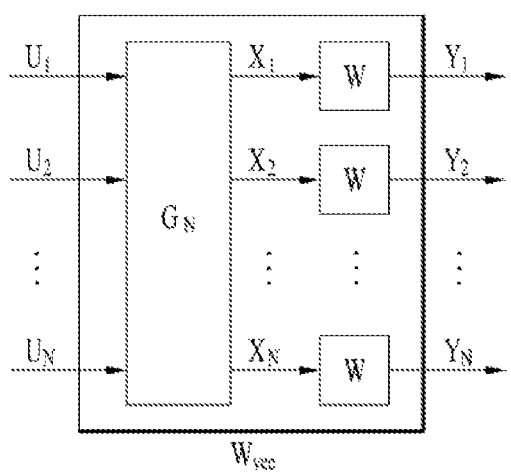

FIG. 5 illustrates the concept of channel combining and channel splitting for channel polarization. As illustrated in FIG. 5, when N copies of an original channel W are properly combined to create a vector channel $W_{vec}$ and then are split into new polarized channels, the new polarized channels are categorized into channels having capacity C(W)=1 and channels having C(W)=0 if N is sufficiently large. In this case, since bits passing through the channels having the channel capacity C(W))=1 are transmitted without error, it is better to transmit information bits therethrough and, since bits passing through the channels having capacity C(W)=0 cannot transport information, it is better to transport frozen bits, which are meaningless bits, therethrough.

Referring to FIG. 5, copies of a given B-DMC W are combined in a recursive manner to output a vector channel $W_{vec}$ given by $X_N \to Y_N$, where $N=2^n$ and n is an integer equal to or greater than 0. Recursion always begins at the 0th level and $W_1=W$. If n is 1 (n=1), this means the first level of recursion in which two independent copies of $W_1$ are combined. If the above two copies are combined, a channel $W_2$: $X_2 \to Y_2$ is obtained. A transitional probability of this new channel $W_2$ may be represented by the following equation.

$$W_2(y_1,y_2|u_1,u_2)=W(y_1|u_1\oplus u_2)W(y_1|u_2) \quad \text{Equation 3}$$

If the channel $W_2$ is obtained, two copies of the channel $W_2$ are combined to obtain a single copy of a channel $W_4$. Such recursion may be represented by $W_4: X_4 \to Y_4$ having the following transitional probability.

$$W_4(y_1^4|u_1^4)=W_2(y_1^2|u_1\oplus u_2,u_3\oplus u_4)W_2(y_3^4|u_2,u_4) \quad \text{Equation 4}$$

In FIG. 5, $G_N$ is a size-N generator matrix. $G_2$ corresponds to the base matrix F illustrated in FIG. 4(b). $G_4$ may be represented by the following matrix.

$$G_4 = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \begin{bmatrix} 1 & 0 \\ 1 & 1 \end{bmatrix}^{\otimes 2} = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \quad \text{Equation 5}$$

Herein, $\otimes$ denotes the Kronecker product, $A^{\otimes n}=A \otimes A^{\otimes (n-1)}$ for all $n \geq 1$, and $A^{\otimes 0}=1$.

The relationship between input $u_1^N$ to $G_N$ and output $x_1^N$ of $G_N$ of FIG. 5(b) may be represented as $x_1^N=u_1^N G_N$, where $x_1^N=\{x_1, \ldots, x_N\}$, $u_1^N=\{u_1, \ldots, u_N\}$ When N B-DMCs are combined, each B-DMC may be expressed in a recursive manner. That is, $G_N$ may be indicated by the following equation.

$$G_N=B_N F^{Wn} \quad \text{Equation 6}$$

Herein, $N=2^n$, $n \geq 1$, $F^{\otimes n}=F \otimes F^{\otimes (n-1)}$, and $F^{\otimes 0}=1$. $B_N$ is a permutation matrix known as a bit-reversal operation and $B_N=R_N(I_2 \otimes B_{N/2})$ and may be recursively computed. $I_2$ is a 2-dimensional identity matrix and this recursion is initialized to $B_2=I_2$. $R_N$ is a bit-reversal interleaver and is used to map an input $s_1^N=\{s_1, \ldots, s_N\}$ to an output $x_1^N=\{s_1, s_3, \ldots, s_{N-1}, s_2, \ldots, s_N\}$. The bit-reversal interleaver may not be included in a transmitting side. The relationship of Equation is illustrated in FIG. 6.

Figure 6:
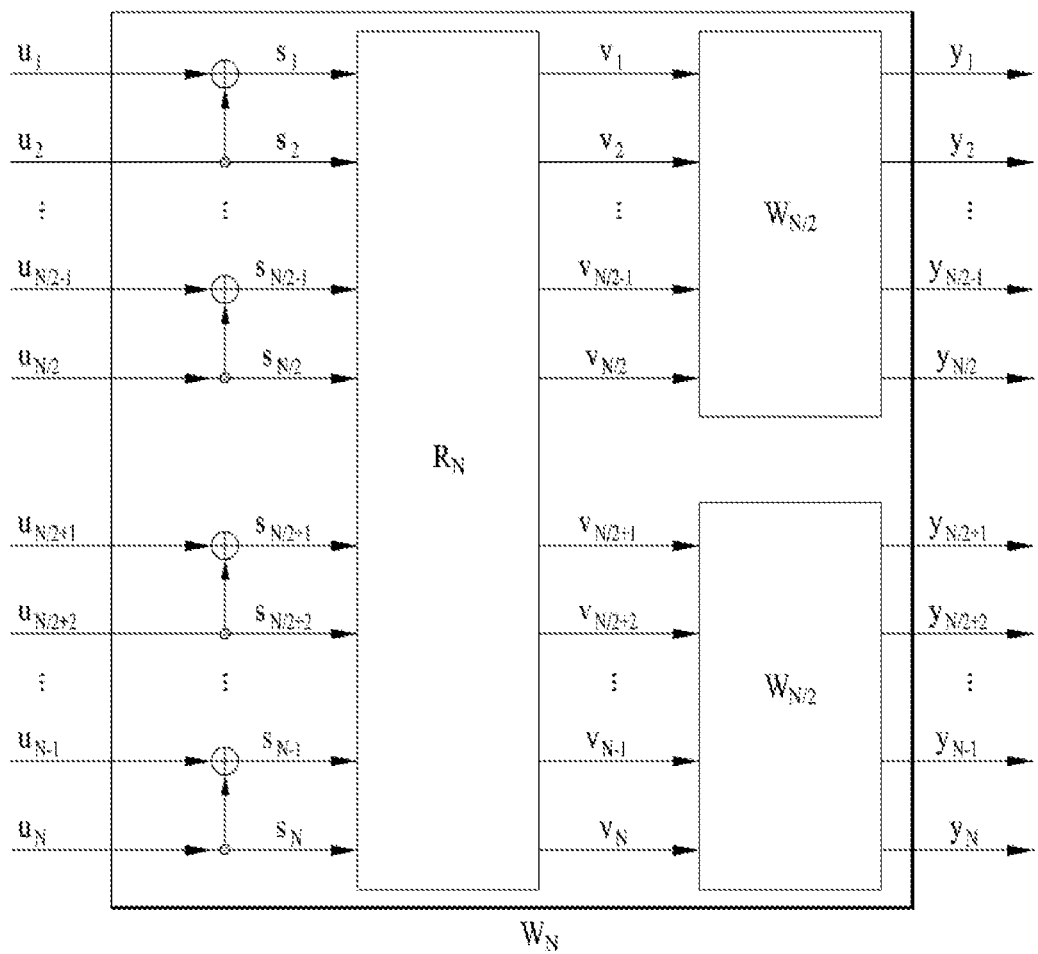
FIG. 6 illustrates N-th level channel combining for a polar code.

FIG. 6 illustrates N-th level channel combining for a polar code.

A process of defining an equivalent channel for specific input after combining N B-DMCs Ws is called channel splitting. Channel splitting may be represented as a channel transition probability indicated by the following equation.

$$W_N^i(y_1^N, u_1^{i-1} | u_i) = \sum_{u_{i+1}^N} \frac{1}{2^{N-1}} W_N(y_1^N | u_1^N) \quad \text{Equation 7}$$

Channel polarization has the following characteristics:
Conservation: $C(W^-)+C(W^+)=2C(W)$,
Extremization: $C(W^-) \leq C(W) \leq C(W^+)$.
When channel combining and channel splitting are performed, the following theorem may be obtained.

Theorem: For any B-DMC W, channels $\{W_N^{(i)}\}$ are polarized in the following sense. For any fixed $\delta \in \{0, 1\}$, as N goes to infinity through powers of 2, the fraction of indexes $i \in \{1, \ldots, N\}$ for channel capacity $I(W_N^{(i)}) \in (1-\delta, 1]$ goes to I(W) and the faction of i for channel capacity $I(W_N^{(i)}) \in [0, \delta)$ goes to 1-I(W). Hence, if $N \to \infty$, then channels are perfectly noisy or are polarized free of noise. These channels can be accurately recognized by the transmitting side. Therefore, bad channels are fixed and non-fixed bits may be transmitted on good channels.

That is, if the size N of polar codes is infinite, a channel has much noise or is free of noise, with respect to a specific input bit. This has the same meaning that the capacity of an equivalent channel for a specific input bit is divided into 0 or I(W).

Inputs of a polar encoder are divided into bit channels to which information data is mapped and bit channels to which the information data is not mapped. As described earlier, according to the theorem of the polar code, if a codeword of the polar code goes to infinity, the input bit channels may be classified into noiseless channels and noise channels. Therefore, if information is allocated to the noiseless bit channels, channel capacity may be obtained. However, in actuality, a codeword of an infinite length cannot be configured, reliabilities of the input bit channels are calculated and data bits are allocated to the input bit channels in order of reliabilities. In the present invention, bit channels to which data bits are allocated are referred to as good bit channels. The good bit channels may be input bit channels to which the data bits are mapped. Bit channels to which data is not mapped are referred to as frozen bit channels. A known value (e.g., 0) is input to the frozen bit channels and then encoding is performed. Any values which are known to the transmitting side and the receiving side may be mapped to the frozen bit channels. When puncturing or repetition is performed, information about the good bit channels may be used. For example, positions of codeword bits (i.e., output bits) corresponding to positions of input bits to which information bits are not allocated may be punctured.

A decoding scheme of the polar codes is a successive cancellation (SC) decoding scheme. The SC decoding scheme obtains a channel transition probability and then calculates a likelihood ratio (LLR) of input bits using the channel transition probability. In this case, the channel transition probability may be calculated in a recursive form if channel combining and channel splitting procedures use characteristics of the recursive form. Therefore, a final LLR value may also be calculated in the recursive form. First, a channel transition probability $W_N^{(i)}(y_1^N, u_1^{i-1}|u_i)$ of an input bit $u_i$ may be obtained as follows. $u_1^i$ may be split into odd indexes and even indexes as expressed as $u_{1,o}{}^i$, $u_{1,e}{}^i$, respectively. The channel transition probability may be indicated by the following equations.

$$W_{2N}^{(2i-1)}(y_1^{2N}, u_1^{2i-1} \mid u_{2i-1}) = \sum_{u_{2i}^{2N}} \frac{1}{2^{2N-1}} W_{2N}(y_1^{2N} \mid u_1^{2N})$$

$$= \sum_{u_{2i,o}^{2N}, u_{2i,e}^{2N}} \frac{1}{2^{2N-1}} W_N(y_1^N \mid u_{1,o}^{2N} \oplus u_{i,e}^{2N})$$

$$W_N(y_{N+1}^{2N} \mid u_{1,e}^{2N})$$

$$= \sum_{u_{2i}} \frac{1}{2} \sum_{u_{2i+1,e}^{2N}} \frac{1}{2^{N-1}} W_N(y_{N+1}^{2N} \mid u_{1,e}^{2N}) \cdot$$

$$\sum_{u_{2i+1,o}^{2N}} \frac{1}{2^{N-1}} W_N(y_1^N \mid u_{1,o}^{2N} \oplus u_{i,e}^{2N})$$

$$= \sum_{u_{2i}} \frac{1}{2} W_N^{(i)}(y_1^N, u_{1,o}^{2i-2} \oplus u_{i,e}^{2i-2} \mid u_{2i-1} \oplus u_{2i}) \cdot$$

$$W_N^{(i)}(y_{N+1}^{2N}, u_{i,e}^{2i-2} \mid u_{2i})$$

Equation 8 where $W_N^{(i)}(y_1^N, u_1^{i-1} \mid u_1) = \sum_{u_{i+1}^N} \frac{1}{2^{N-1}} W_N(y_1^N \mid u_1^N)$.

Equation 9

$$W_{2N}^{(2i)}(y_1^{2N}, u_1^{2i-1} \mid u_{2i}) = \sum_{u_{2i+1}^{2N}} \frac{1}{2^{2N-1}} W_{2N}(y_1^{2N} \mid u_1^{2N})$$

$$= \sum_{u_{2i+1,o}^{2N}, u_{2i+1,e}^{2N}} \frac{1}{2^{2N-1}} W_N(y_1^N \mid u_{1,o}^{2N} \oplus u_{i,e}^{2N})$$

$$W_N(y_{N+1}^{2N} \mid u_{1,e}^{2N})$$

$$= \frac{1}{2} \sum_{u_{2i+1,e}^{2N}} \frac{1}{2^{N-1}} W_N(y_{N+1}^{2N} \mid u_{1,e}^{2N}) \cdot$$

$$\sum_{u_{2i+1,o}^{2N}} \frac{1}{2^{N-1}} W_N(y_1^N \mid u_{1,o}^{2N} \oplus u_{i,e}^{2N})$$

$$= \frac{1}{2} W_N^{(i)}(y_1^N, u_{1,o}^{2i-2} \oplus u_{i,e}^{2i-2} \mid u_{2i-1} \oplus u_{2i}) \cdot$$

$$W_N^{(i)}(y_{N+1}^{2N}, u_{i,e}^{2i-2} \mid u_{2i})$$

A polar decoder retrieves information and generates an estimate $\hat{u}^N_1$ of $u^N_1$ using values (e.g., reception bits, frozen bits, etc.) known for the polar codes. The LLR is defined as follows.

$$L_N^{(i)}(y_1^N, u_1^{i-1}) = \frac{W_N^{(i)}(y_1^N, u_1^{i-1} \mid u_i = 0)}{W_N^{(i)}(y_1^N, u_1^{i-1} \mid u_i = 1)}$$

Equation 10

The LLR may be recursively calculated as follows.

$$L_N^{(2i-1)}(y_1^N, \hat{u}_1^{2i-2}) =$$

$$\frac{L_{N/2}^{(i)}(y_1^{N/2}, \hat{u}_{1,o}^{2i-2} \oplus \hat{u}_{1,e}^{2i-2}) \cdot L_{N/2}^{(i)}(y_{N/2+1}^N, \hat{u}_{1,e}^{2i-2}) + 1}{L_{N/2}^{(i)}(y_1^{N/2}, \hat{u}_{1,o}^{2i-2} \oplus \hat{u}_{1,e}^{2i-2}) + L_{N/2}^{(i)}(y_{N/2+1}^N, \hat{u}_{1,e}^{2i-2})}$$

$$L_N^{(2i)}(y_1^N, \hat{u}_1^{2i-1}) =$$

$$[L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}(y_{N/2+1}^N, \hat{u}_{1,e}^{2i-2})$$

Equation 11

Recursive calculation of LLRs is traced back to a code length of 1 with an LLR $L^{(1)}_1(y_i) = W(y_i \mid 0)/W(y_i \mid 1)$. $L^{(1)}_1(y_i)$ is soft information observed from a channel.

The complexity of a polar encoder and an SC decoder varies with the length N of polar codes and is known as having O(N log N). Assuming that K input bits are used for a length-N polar code, a coding rate becomes N/K. If a generator matrix of a polar encoder of a data payload size N is $G_N$, an encoded bit may be represented as $x^N_1 = u^N_1 G_N$. It is assumed that K bits out of $u^N_1$ correspond to payload bits, a row index of $G_N$ corresponding to the payload bits is i, and a row index of $G_N$ corresponding to (N−K) bits is F. A minimum distance of the polar codes may be given as $d_{min}(C) = \min_{i \in I} 2^{wt(i)}$, where wt(i) is the number of 1s within binary extension of i and i=0, 1, ..., N−1.

SC list (SCL) decoding is an extension of a basic SC decoder. In this type of decoder, L decoding paths are simultaneously considered in each decoding stage. Herein, L is an integer. In other words, in the case of the polar codes, a list-L decoding algorithm is an algorithm for simultaneously tracking L paths in a decoding process.

Figure 7:
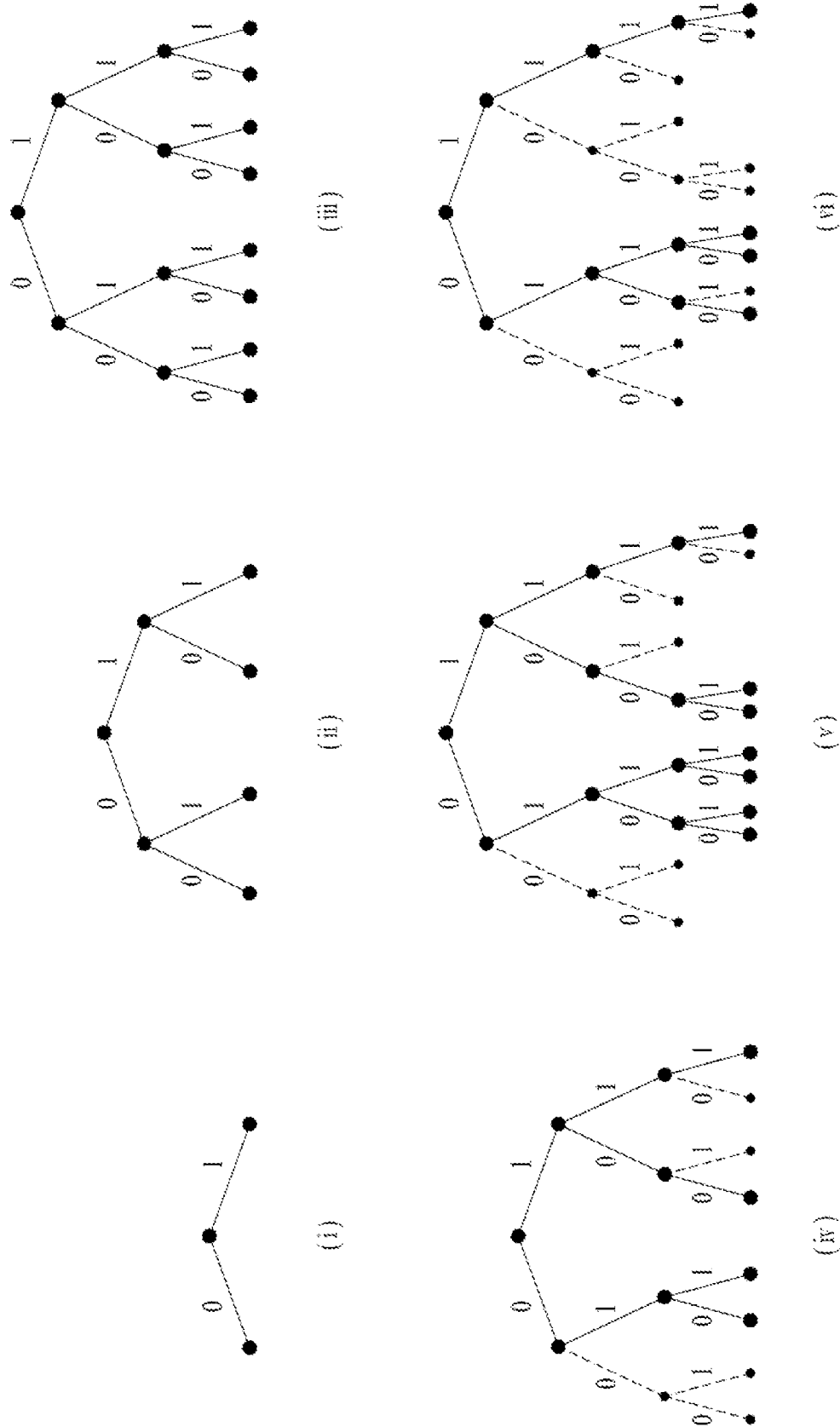
FIG. 7 illustrates an evolution of decoding paths in a list-L decoding process.

FIG. 7 illustrates an evolution of decoding paths in a list-L decoding process. For convenience of description, it is assumed that the number of bits that should be determined is n and all bits are not frozen. If a list size L is 4, each level includes at most 4 nodes with paths that continue downward. Discontinued paths are expressed by dotted lines in FIG. 7. A process in which decoding paths evolve in list-L decoding will now be described with reference to FIG. 7. i) If list-L decoding is started, the first unfrozen bit may be either 0 or 1. ii) list-L decoding continues. The second unfrozen bits may be either 0 or 1. Since the number of paths is not greater than L=4, pruning is not needed yet. iii) Consideration of all options for the first bit (i.e., a bit of the first level), the second bit (i.e. a bit of the second level), and the third bit (i.e., a bit of the third level) results in 8 decoding paths which are excessive because L=4. iv) the 8 decoding paths are pruned to L (=4) promising paths. v) 4 active paths continue by considering two options of the fourth unfrozen bit. In this case, the number of paths is doubled, i.e., 8 paths which are excessive because L=4. vi) The 8 paths are pruned back to L (=4) best paths. In the example of FIG. 7, 4 candidate codewords 0100, 0110, 0111, and 1111 are obtained and one of the codewords is determined to be a codeword most similar to an original codeword. In a similar manner to a normal decoding process, for example, in a pruning process or a process of determining a final codeword, a path in which the sum of LLR absolute values is largest may be selected as a survival path. If a CRC is present, the survival path may be selected through the CRC.

Meanwhile, CRC-aided SCL decoding is SCL decoding using CRC and improves the performance of polar codes. CRC is the most widely used technique in error detection and error correction in the field of information theory and coding. For example, if an input block of an error correction encoder has K bits and the length of information bits is k, and the length of CRC sequences is m bits, then K=k+m. CRC bits are a part of source bits for an error correction code. If the size of channel codes used for encoding is N, a code rate R is defined as R=K/N. CRC aided SCL decoding serves to detect an errorless path while a receiving device confirms a CRC code with respect to each path. An SCL decoder outputs candidate sequences to a CRC detector. The CRC detector feeds back a check result in order to aid in determining a codeword.

Although complicated as compared with an SC algorithm, SCL decoding or CRC aided SCL decoding has an advantage of excellent decoding performance. For more details of a list-X decoding algorithm of the polar codes, refer to 'I. Tal and A. Vardy, "List decoding of polar codes," in Proc. IEEE Int. Symp. Inf. Theory, pp. 1-5, July 2011'.

In the polar codes, code design is independent of a channel and hence is not versatile for mobile fading channels. In addition, the polar codes have a disadvantage of limited application because the codes have recently been introduced and have not grown yet. That is, polar coding proposed up to now has many parts that have not been defined to apply to a wireless communication system. Therefore, the present invention proposes a polar coding method suitable for the wireless communication system.

Figure 8:
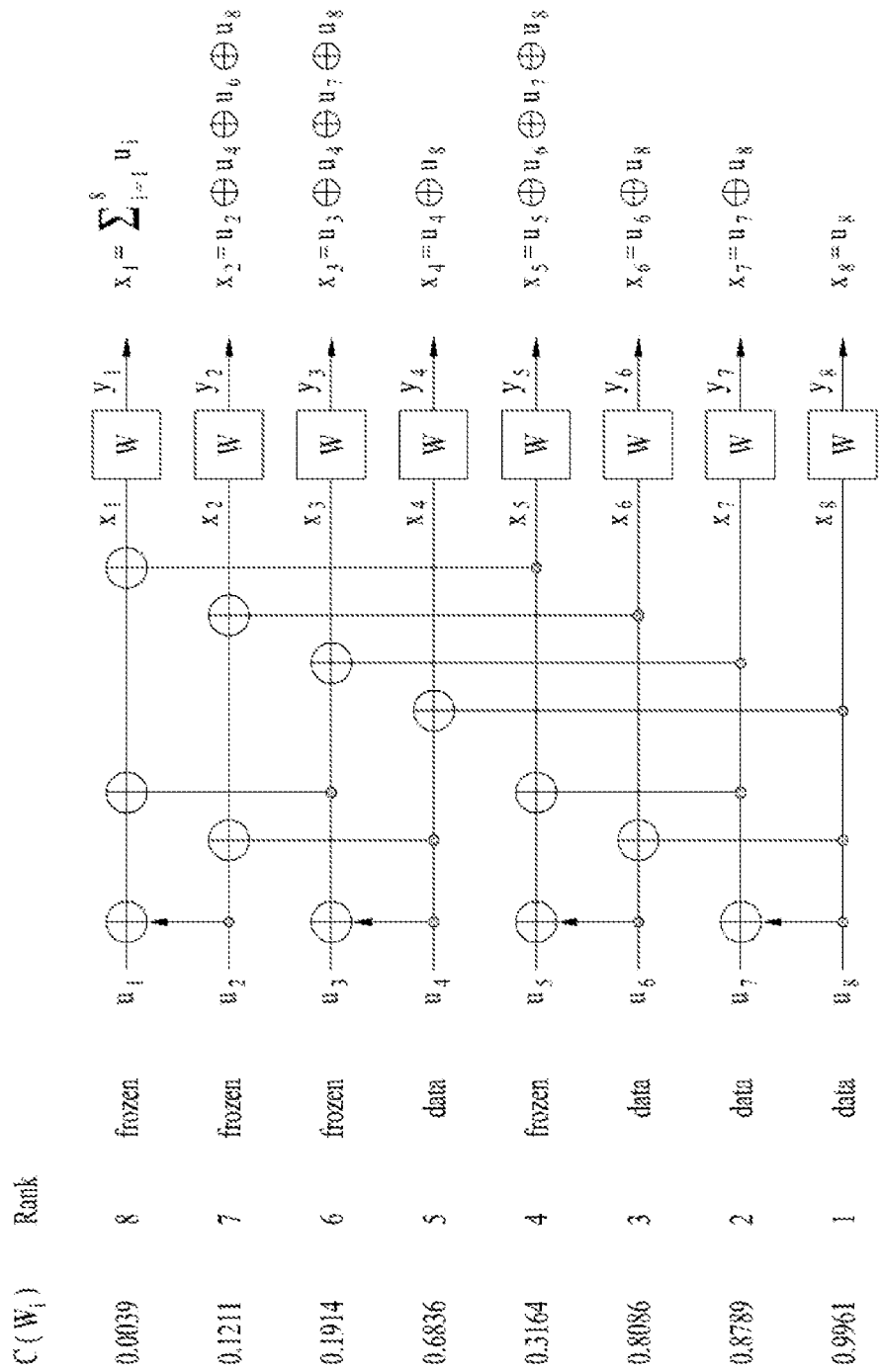
FIG. 8 illustrates the concept of selecting position(s) to which information bit(s) are to be allocated in polar codes.

FIG. 8 illustrates the concept of selecting position(s) to which information bit(s) are to be allocated in polar codes.

In FIG. 8, it is assumed that the size N of mother codes is 8, i.e., the size N of polar codes is 8, and a code rate is 1/2.

In FIG. 8, $C(W_i)$ denotes the capacity of a channel $W_i$ and corresponds to the reliability of channels that input bits of a polar code experience. When channel capacities corresponding to input bit positions of the polar code are as illustrated in FIG. 8, reliabilities of the input bit positions are ranked as illustrated in FIG. 8. To transmit data at a code rate of 1/2, a transmitting device allocates 4 bits constituting the data to 4 input bit positions having high channel capacities among 8 input bit positions (i.e., input bit positions denoted as $U_4$, $U_6$, $U_7$, and $U_8$ among input bit positions $U_1$ to $U_8$ of FIG. 8) and freezes the other input bit positions. A generator matrix $G_8$ corresponding to the polar code of FIG. 8 is as follows. The generator matrix $G_8$ may be acquired based on Equation 6.

$$G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Equation 12}$$

The input bit positions denoted as $U_1$ to $U_8$ of FIG. 8 correspond one by one to rows from the highest row to the lowest row of $G_8$. Referring to FIG. 8, it may be appreciated that the input bit corresponding to $U_8$ affects all output coded bits. On the other hand, it may be appreciated that the input bit corresponding to $U_1$ affects only $Y_1$ among the output coded bits. Referring to Equation 12, when binary-input source bits $U_1$ to $U_8$ are multiplied by $G_8$, a row in which the input bits appear at all output bits is the lowest row [1, 1, 1, 1, 1, 1, 1, 1] in which all elements are 1, among rows of $G_8$. Meanwhile, a row in which the binary-input source bits appears at only one output bit is a row in which one element is 1 among the rows of $G_8$, i.e., a row [1, 0, 0, 0, 0, 0, 0, 0] in which a row weight is 1. Similarly, it may be appreciated that a row in which a row weight is 2 reflects input bits corresponding to the row in two output bits. Referring to FIG. 8 and Equation 12, $U_1$ to $U_8$ correspond one by one to the rows of $G_8$ and bit indexes for distinguishing between input positions of $U_1$ to $U_8$, i.e., bit indexes for distinguishing between the input positions, may be assigned to the rows of $G_8$.

Hereinafter, for Polar codes, it may be assumed that bit indexes from 0 to N-1 are sequentially allocated to rows of $G_N$ starting from the highest row having the smallest row weight with respect to N input bits. For example, referring to FIG. 8, a bit index 0 is allocated to the input position of $U_1$, i.e., the first row of $G_8$ and a bit index 7 is allocated to the input position of $U_8$, i.e., the last row of $G_8$. However, since the bit indexes are used to indicate input positions of the polar code, a scheme different from the above allocation scheme may be used. For example, bit indexes from 0 to N-1 may be allocated staring from the lowest row having the largest row weight.

In the case of output bit indexes, as illustrated in FIG. 8 and Equation 12, it may be assumed that bit indexes from 0 to N-1 or bit indexes from 1 to N are assigned to columns from the first column having the largest column weight to the last column having the smallest column weight among columns of $G_N$.

In Polar codes, setting of information bits and frozen bits is one of the most important elements in the configuration and performance of the polar code. That is, determination of ranks of input bit positions may be an important element in the performance and configuration of the polar code. For Polar codes, bit indexes may distinguish input or output positions of the polar code. In the present invention, a sequence obtained by enumerating reliabilities of bit positions in ascending or descending order are referred to as a bit index sequence. That is, the bit index sequence represents reliabilities of input or output bit positions of the polar code in ascending or descending order. A transmitting device inputs information bits to input bits having high reliabilities based on the input bit index sequence and performs encoding using the polar code. A receiving device may discern input positions to which information bits are allocated or input positions to which frozen bits are allocated, using the same or corresponding input bit index sequence. That is, the receiving device may perform polar decoding using an input bit index sequence which is identical to or corresponds to an input bit index sequence used by the transmitting device and using a corresponding polar code. In the following description, it may be assumed that an input bit index sequence is predetermined so that information bit(s) may be allocated to input bit position(s) having high reliabilities. In the present disclosure, the input bit index sequence is also called a Polar sequence.

Figure 9:
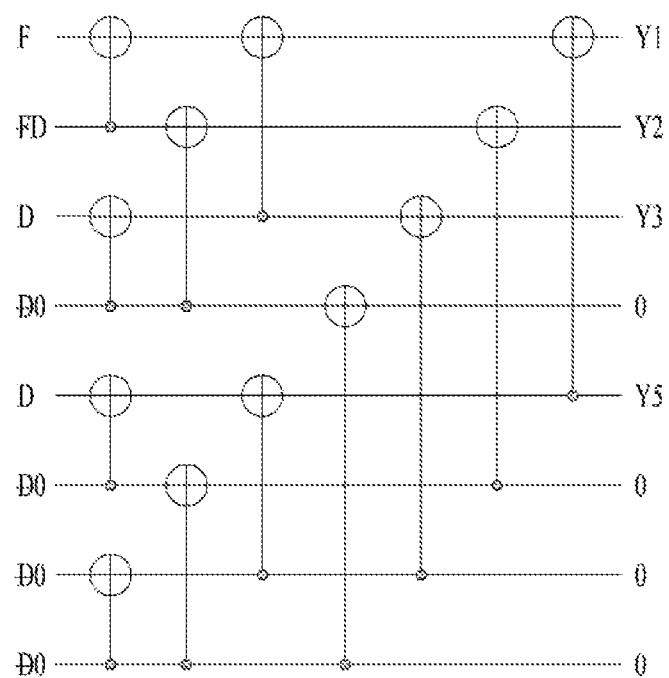
FIG. 9 illustrates puncturing and information bit allocation for Polar codes.

FIG. 9 illustrates puncturing and information bit allocation for polar codes. In FIG. 9, F denotes a frozen bit, D denotes an information bit, and 0 denotes a skipping bit.

Among coded bits, the case in which an information bit is changed to a frozen bit may occur according to an index or position of a punctured bit. For example, if output coded bits for a mother code of N=8 should be punctured in order of Y8, Y7, Y6, Y4, Y5, Y3, Y2, and Y1 and a target code rate is 1/2, then Y8, Y7, Y6, and Y4 are punctured, U8, U7, U6, and U4 connected only to Y8, Y7, Y6, and Y4 are frozen to 0, and these input bits are not transmitted, as illustrated in FIG. 9. An input bit changed to a frozen bit by puncturing of a coded bit is referred to as a skipping bit or a shortening bit and a corresponding input position is referred to as a skipping position or a shortening position. Shortening is a rate matching method of inserting a known bit into an input bit position connected to a position of an output bit desired to be transmitted while maintaining the size of input information (i.e., the size of information blocks). Shortening is possible starting from input corresponding to a column in which a column weight is 1 in a generator matrix $G_N$ and next shortening may be performed with respect to input corresponding to a column in which a column weight is 1 in a remaining matrix from which a column and row in which a column weight is 1 are removed. To prevent all information bits from being punctured, an information bit that should have been allocated to an information bit position may be reallocated in order of a high reliability within a set of frozen bit positions.

In the case of the polar code, decoding may be generally performed in the following order.
1. Bit(s) having low reliabilities are recovered first. Although reliability differs according to the structure of a decoder, since an input index in an encoder (hereinafter, an encoder input bit index or bit index) having a low value usually has a low reliability, decoding is generally performed staring from a low encoder input bit index.
2. When there is a known bit for a recovered bit, the known bit is used together with the recovered bit or the process of I is omitted and a known bit for a specific input bit position is immediately used, thereby recovering an information bit, which is an unknown bit. The information bit may be a source information bit (e.g., a bit of a transport block) or a CRC bit.

Figure 10:
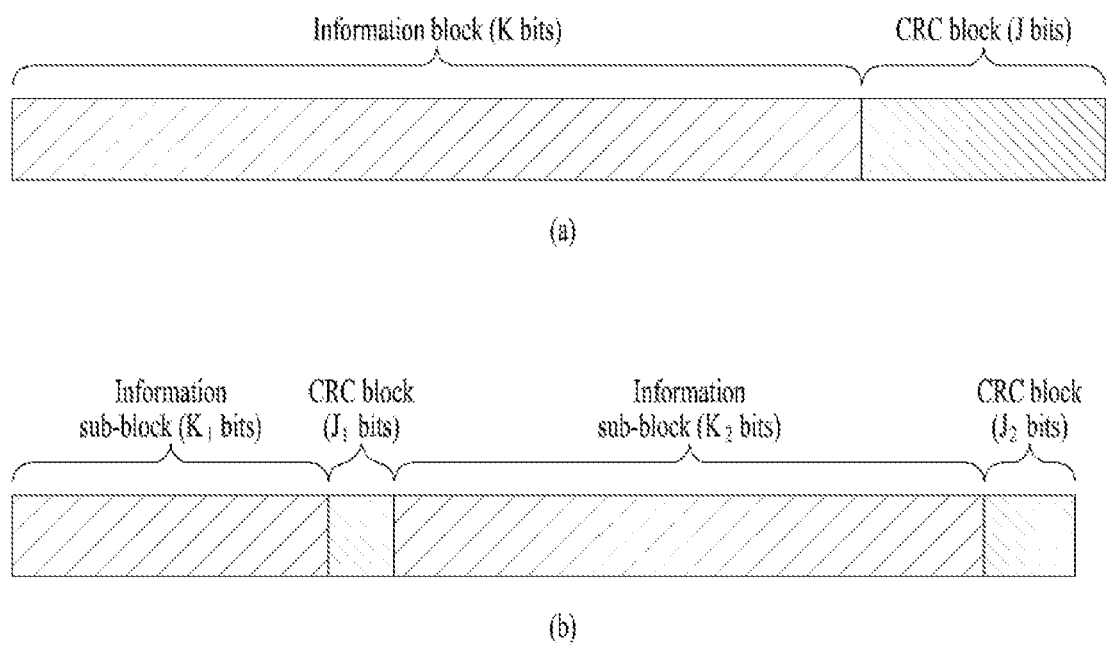
FIG. 10 illustrates the concept of a conventional cyclic redundancy check (CRC) code and a distributed CRC code.

FIG. 10 illustrates the concept of a conventional CRC code and a distributed CRC code. FIG. 10(a) illustrates conventional CRC and FIG. 10(b) illustrates distributed CRC.

In Polar codes, a CRC-aided list (CAL) decoding method is widely used due to superior decoding performance thereof. According to the CAL decoding method, L (where, L is a positive integer) candidate information bit sequences $\{u_i: i=1, \ldots, L\}$ are first decoded. Then, CRC-CHECK for the candidate information bit sequences is performed so that a candidate sequence passing CRC-CHECK is selected as a decoded information bit sequence.

Generally, CRC bits are positioned after information bits as illustrated in FIG. 10(a). Therefore, a decoder generally decodes all information bits and then performs CRC-CHECK for the decoded information bits. However, distributed CRC has recently been proposed to improve a decoding speed of the CAL decoding method. In distributed CRC, CRC bits are appropriately distributed over information bits as illustrated in FIG. 10(b). If distributed CRC is used as illustrated in FIG. 10(b), a decoder may decode a part (e.g., an information sub-block of $K_1$ bits) of information bits and a part (e.g., a CRC block of $J_1$ bits) in a CAL decoding process and perform CRC-CHECK using the decoded blocks. In this case, if CRC-CHECK for all the L candidate information bit sequences fails, the decoder may declare an error and stop decoding. That is, when distributed CRC is used, it is possible perform early termination of decoding in the CAL decoding process. If decoding of a received signal can be terminated early, a receiving device may rapidly determine whether the received signal is a signal therefor, and thus the receiving device increases speed for discovering a signal thereof. Furthermore, since an error of the received signal can be quickly discovered, retransmission for the received signal or next transmission following the received signal may be rapidly performed.

Figure 11:
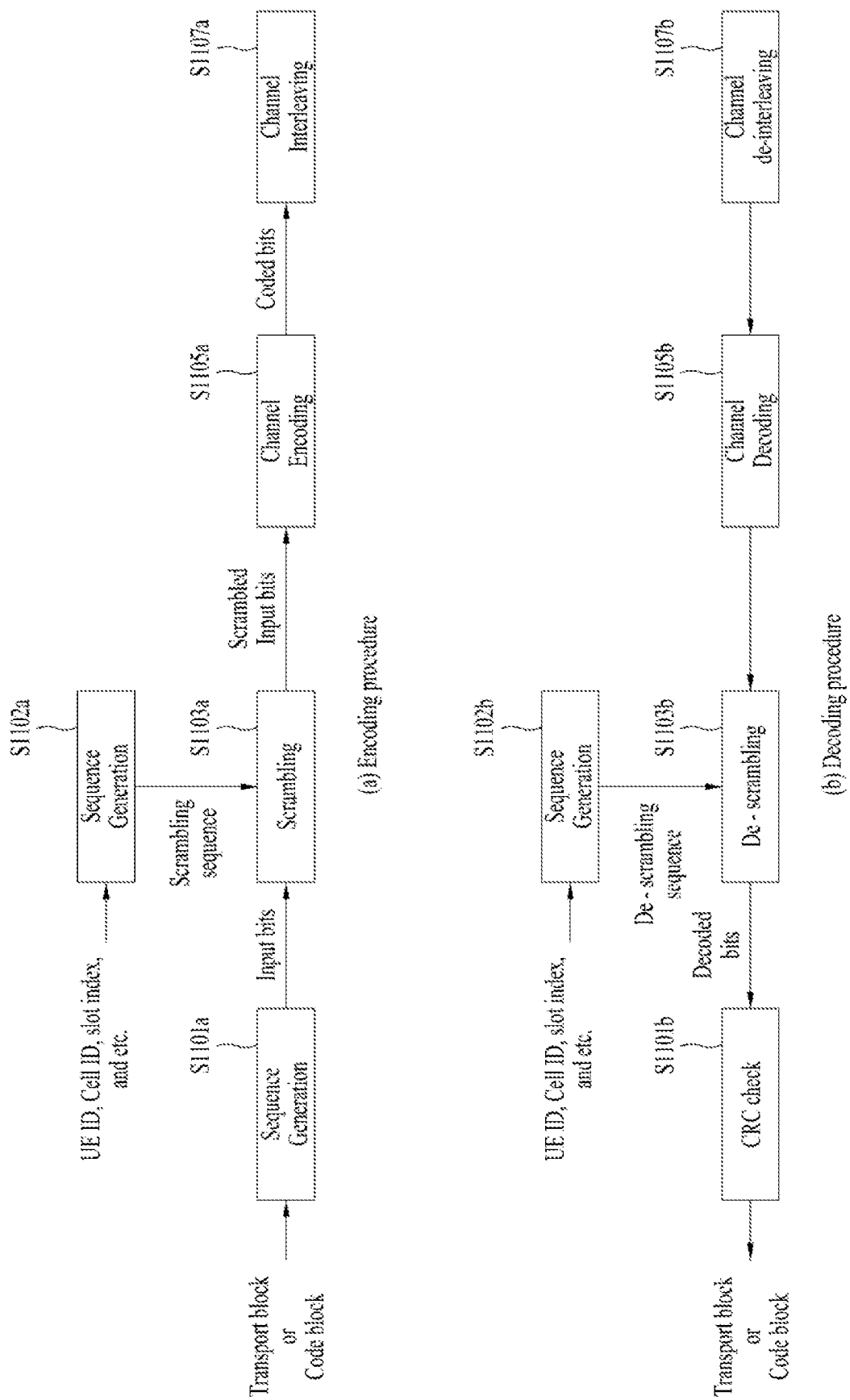
FIG. 11 illustrates an encoding procedure and a decoding procedure in a legacy LTE system.

FIG. 11 illustrates an encoding procedure and a decoding procedure in a legacy LTE system. Particularly, FIG. 11(a) illustrates an encoding procedure including a scrambling process and FIG. 11(b) illustrates a decoding procedure including a descrambling process.

Referring to FIG. 11(a), a transmitting device inserts a CRC code into a transport block or a code block (S1101a) and scrambles obtained input bits using a scrambling sequence (S1103a). The transmitting device channel-encodes the scrambled input bits (S1105a) to generate coded bits and channel-interleaves the coded bits (S1107a). Referring to FIG. 11(b), a receiving device obtains coded bits from received bits based on a channel interleaving pattern applied in the encoding procedure or a channel interleaving pattern corresponding thereto (S1107b) and channel-decodes the coded bits (S1105b) to obtain scrambled bits. The receiving device descrambles the scrambled bits using a scrambling sequence (S1103b) to obtain a sequence of decoded bits (hereinafter, a decoded bit sequence). The receiving device checks whether errors occur in the decoded bit sequence using CRC bits in the decoded bit sequence (S1101b). If CRC for the decoded bit sequence fails, the receiving device determines that decoding of a received signal has failed. If CRC for the decoded bit sequence is successful, the receiving device determines that the decoding procedure has succeeded and may obtain the transport block or the code block by eliminating the CRC bits from the decoded bit sequence.

In FIG. 11(a), CRC generation (S1101a), sequence generation (S1102a), scrambling (S1103a), channel encoding (S1105a), and channel interleaving (S1107a) may be performed by a CRC code generator, a sequence generator, a scrambler, a channel encoder, and a channel interleaver, respectively. The CRC code generator, the sequence generator, the scrambler, the channel encoder, and the channel interleaver may constitute a part of a processor of the transmitting device and may be configured to be operated under control of the processor of the transmitting device. In FIG. 11(b), CRC check (S1101b), sequence generation (S1102b), descrambling (S1103b), channel decoding (S1105b), and channel interleaving (S1107b) may be performed by a CRC checker, a sequence generator, a descrambler, a channel decoder, and a channel interleaver, respectively. The CRC checker, the sequence generator, the descrambler, the channel decoder, and the channel interleaver may constitute a part of a processor of the receiving device and may be configured to be operated under control the processor of the receiving device. In the legacy LTE system, the scrambler generates an m-sequence using a UE ID, a cell ID, and/or a slot index and then scrambles input bits consisting of information bits and CRC bits, which are input to the scrambler, using the m-sequence. The descrambler generates an m-sequence using a UE ID, a cell ID, and/or a slot index and then descrambles input bits consisting of information bits and CRC bits, which are input to the descrambler, using the m-sequence.

Some process(es) of the encoding procedure or some process(es) of the decoding procedure may be omitted according to types of transport channels or types of control information. Even in an NR system as well as the legacy LTE system, an encoding or decoding procedure similar to the encoding or decoding procedure illustrated in FIG. 11 is used. However, the LTE system and the NR system may use different coding schemes in the channel encoding/decoding process. For example, the legacy LTE system uses channel coding schemes listed in Table 1 and Table 2 below, whereas the NR system is expected to use an LDPC code and a Polar code for channel coding. Table 1 lists channel coding schemes and coding rates for transport blocks, used in the LTE system. Table 2 lists channel coding schemes and coding rates for control information, used in the LTE system.

TABLE 1

| TrCH | Coding scheme | Coding rate |
|---|---|---|
| UL-SCH | Turbo coding | 1/3 |
| DL-SCH | | |
| PCH | | |
| MCH | | |
| SL-SCH | | |
| SL-DCH | | |
| BCH | Tail biting convolutional | 1/3 |
| SL-BCH | coding | |

TABLE 2

| Control Information | Coding scheme | Coding rate |
|---|---|---|
| DCI | Tail biting convolutional coding | 1/3 |
| CFI | Block code | 1/16 |
| HI | Repetition code | 1/3 |
| UCI | Block code | Variable |
| | Tail biting convolutional coding | 1/3 |
| SCI | Tail biting convolutional coding | 1/3 |

For more details of the encoding procedure and decoding procedure of the legacy LTE system, reference may be made to 3GPP TS 36.211, 3GPP TS 36.212, 3GPP 36.331, and/or 3GPP TS 36.331. For more details of the encoding procedure and decoding procedure of the NR system, reference may be made to 3GPP TS 38.211, 3GPP TS 38.212, 3GPP TS 38.213, 3GPP TS 38.214, and/or 3GPP TS 38.331.

Figure 12:
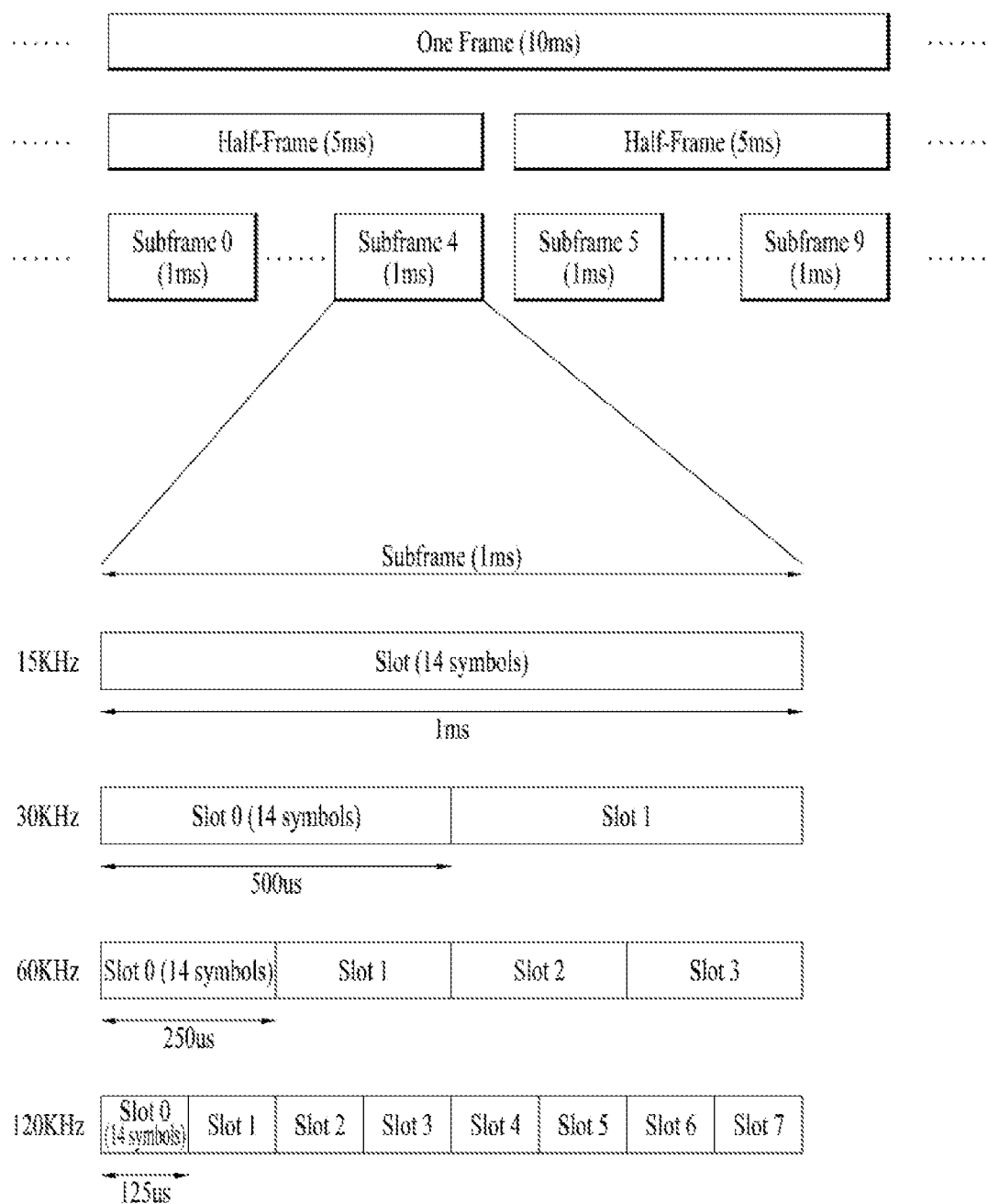
FIG. 12 illustrates a frame structure.

FIG. 12 illustrates a frame structure. The frame structure illustrated in FIG. 12 is purely exemplary and the number of subframes, the number of slots, and/or the number of symbols in a frame may be variously changed. In the NR system, an OFDM numerology (e.g., subcarrier spacing (SCS)) may be differently configured between a plurality of cells aggregated for one UE. Therefore, an (absolute time) duration of a time resource (e.g. a subframe, a slot, or a transmission time interval (TTI)) including the same number of symbols may be differently configured between the aggregated cells. Herein, symbols may include OFDM symbols (or CP-OFDM symbols), SC-FDMA symbols (or discrete Fourier transform-spread-OFDM (DFT-s-OFDM) symbols).

Referring to FIG. 12, in the NR system, downlink and uplink transmissions are organized into frames. Each frame has $T_f$=10 ms duration. Each frame is divided into two half-frames, where each of the half-frames has 5 ms duration. Each half-frame consists of 5 subframes, where the duration $T_{sf}$ per subframe is 1 ms. Each subframe is divided into slots and the number of slots in a subframe depends on a subcarrier spacing. Each slot includes 14 or 12 OFDM symbols based on a cyclic prefix (CP). In a normal CP, each slot includes 14 OFDM symbols and, in an extended CP, each slot includes 12 OFDM symbols. The following table shows the number of OFDM symbols per slot, the number of slots per frame, and the number of slots per for the normal CP, according to the subcarrier spacing $\Delta f = 2^u * 15$ kHz.

TABLE 3

| u | $N^{slot}_{symb}$ | $N^{frame,u}_{slot}$ | $N^{subframe,u}_{slot}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

The following table shows the number of OFDM symbols per slot, the number of slots per frame, and the number of slots per for the extended CP, according to the subcarrier spacing $\Delta f = 2^u * 15$ kHz.

TABLE 4

| u | $N^{slot}_{symb}$ | $N^{frame,u}_{slot}$ | $N^{subframe,u}_{slot}$ |
|---|---|---|---|
| 2 | 12 | 40 | 4 |

A slot includes plural symbols (e.g., 14 or 12 symbols) in the time domain. For each numerology (e.g. subcarrier spacing) and carrier, a resource grid of $N^{size,u}_{grid,x} * N^{RB}_{sc}$ subcarriers and $N^{subframe,u}_{symb}$ OFDM symbols is defined, starting at common resource block (CRB) $N^{start,u}_{grid}$ indicated by higher-layer signaling (e.g. radio resource control (RRC) signaling), where $N^{size,u}_{grid,x}$ is the number of resource blocks (RBs) in the resource grid and the subscript x is DL for downlink and UL for uplink. $N^{RB}_{sc}$ is the number of subcarriers per RB. In the 3GPP based wireless communication system, $N^{RB}_{sc}$ is 12 generally. There is one resource grid for a given antenna port p, subcarrier spacing configuration u, and transmission direction (DL or UL). The carrier bandwidth $N^{size,u}_{grid}$ for subcarrier spacing configuration u is given by the higher-layer parameter (e.g. RRC parameter). Each element in the resource grid for the antenna port p and the subcarrier spacing configuration u is referred to as a resource element (RE) and one complex symbol may be mapped to each RE. Each RE in the resource grid is uniquely identified by an index k in the frequency domain and an index l representing a symbol location relative to a reference point in the time domain. In the NR system, an RB is defined by 12 consecutive subcarriers in the frequency domain. In the NR system, RBs are classified into CRBs and physical resource blocks, (PRBs). CRBs are numbered from 0 and upwards in the frequency domain for subcarrier spacing configuration u. The center of subcarrier 0 of CRB 0 for subcarrier spacing configuration u coincides with 'point A' which serves as a common reference point for resource block grids. PRBs are defined within a bandwidth part (BWP). and numbered from 0 to $N^{size}_{BWP,i}-1$, where i is the number of the bandwidth part. The relation between the physical resource block $n_{PRB}$ in the bandwidth part i and the common resource block $n_{CRB}$ is as follows: $n_{PRB}=n_{CRB}+N^{size}_{BWP,i}$, where $N^{size}_{BWP,i}$ is the common resource block where bandwidth part starts relative to CRB 0. The BWP includes a plurality of consecutive RBs in a frequency domain. A carrier may include a maximum of N (e.g., 5) BWPs. In the 3GPP based wireless communication system, if a UE is powered on or newly enters a cell, the UE performs an initial cell search procedure of acquiring time and frequency synchronization with the cell and detecting a physical cell identity $N^{cell}_{ID}$ of the cell. To this end, the UE may establish synchronization with the BS by receiving synchronization signals, e.g. a primary synchronization signal (PSS) and a secondary synchronization signal (SSS), from the BS and obtain information such as a cell identity (ID). A UE, which has demodulated a DL signal by performing a cell search procedure using an SSS and determined time and frequency parameters necessary for transmitting a UL signal at an accurate time, can communicate with a BS only after acquiring system information necessary for system configuration of the UE from the BS. In the 3GPP based wireless communication system, the system information is configured by a master information block (MIB) and system information blocks (SIBs). Each SIB includes a set of parameters associated functionally with each other. The SIBs are classified into a master information block (MIB), an SIB type 1 (SIB1), and other SIBs, according to parameters that each block includes. The MIB includes most frequently transmitted parameters which are essential for the UE to perform initial access to the network of the BS. The UE may receive the MIB over a broadcast channel (e.g., PBCH). After initial cell search, the UE may perform a random access procedure in order to complete access to the BS. To this end, the UE may transmit a preamble over a physical random access channel (PRACH) and receive a response message to the preamble over a PDCCH and a PDSCH. For reference, in a contention-based random access procedure, the UE may transmit an RACH preamble (message 1 (msg1)) using a PRACH resource and the BS may transmit a random access response (RAR) (msg2) to the RACH preamble. The UE may transmit msg3 (e.g., RRC Connection Request) using a UL grant in the RAR and the BS may transmit a contention resolution message (msg4) to the UE. Upon completing the above-described procedure, the UE may perform PDCCH/PDSCH reception and PUSCH/PUCCH transmission as a normal UL/DL signal transmission procedure.

In a legacy LTE/LTE-A system, a PSS/SSS is transmitted omni-directionally. Meanwhile, a method is considered in which a gNB which uses millimeter wave (mmWave) transmits a signal such as a PSS/SSS/PBCH through beamforming (BF) while sweeping beam directions. Transmission/reception of a signal while sweeping beam directions is referred to as beam sweeping or beam scanning. In the present invention, "beam sweeping" represents a behavior of a transmitter and "beam scanning" represents a behavior of a receiver. For example, assuming that the gNB may have a maximum of N beam directions, the gNB transmits a signal such as a PSS/SSS/PBCH in each of the N beam directions. That is, the gNB transmits a synchronization signal such as the PSS/SSS/PBCH in each direction while sweeping directions that the gNB can have or the gNB desires to support. Alternatively, when the gNB can form N beams, one beam group may be configured by grouping a few beams and the PSS/SSS/PBCH may be transmitted/received with respect to each beam group. In this case, one beam group includes one or more beams. The signal such as the PSS/SSS/PBCH transmitted in the same direction may be defined as one synchronization (SS) block and a plurality of SS blocks may be present in one cell. When the plural SS blocks are present, SS block indexes may be used to distinguish between the SS blocks. For example, if the PSS/SSS/PBCH is transmitted in 10 beam directions in one system, the PSS/SSS/PBCH transmitted in the same direction may constitute one SS block and it may be understood that 10 SS blocks are present in the system. In the present invention, a beam index may be interpreted as an SS block index.

Figure 13:
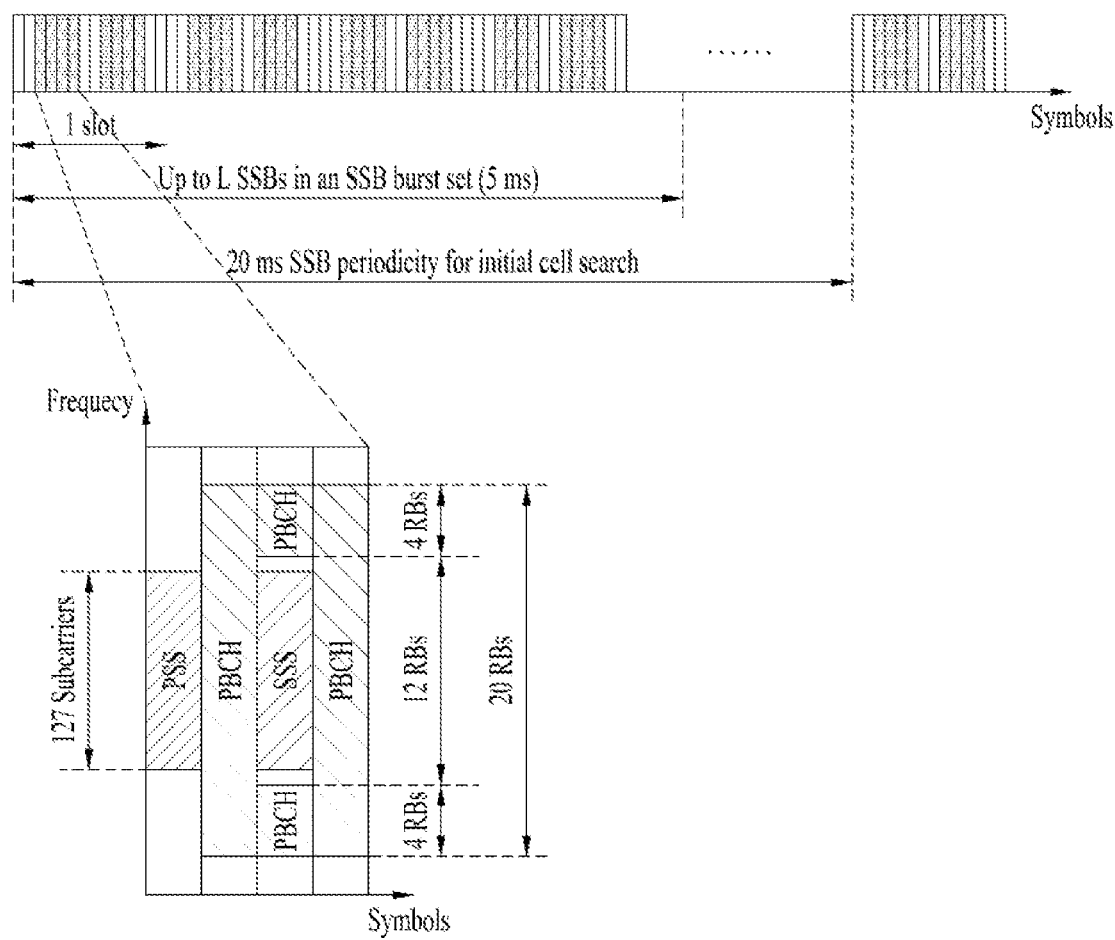
FIG. 13 illustrates the structure of a synchronization signal and physical broadcast channel (PBCH) block (SSB).

FIG. 13 illustrates the structure of a synchronization signal and PBCH block (SSB). A slot may include a maximum of two SSBs.

Referring to FIG. 13, an SSB includes 4 consecutive OFDM symbols. A PSS, a PBCH, an SSS/PBCH, and a PBCH are transmitted on respective OFDM symbols. The PSS may be used for UE(s) to detect a cell ID within a cell ID group and the SSS may be used for UE(s) to detect the cell ID group. The PBCH is used for UE(s) to detect an SSB (time) index and a half-frame and includes an MIB. The PBCH includes a data resource element (RE) and a demodulation reference signal (DMRS) RE on each OFDM symbol. 3 DMRS REs are present in each RB and 3 data REs are present between the DMRS REs. In the 3GPP based system, an RB is defined as 12 consecutive subcarriers in the frequency domain. Each RE is defined by one subcarrier in the frequency domain and one OFDM symbol in the time domain.

The SSB is periodically transmitted at an SSB periodicity. A basic SSB periodicity used for initial cell selection is defined as 20 ms. After cell access, the SSB periodicity may be set to one of {5 ms, 10 ms, 20 ms, 40 ms, 80 ms, 160 ms}. An SSB burst set is configured at a start part of each SSB periodicity. The SSB burst set includes a time window of 5 ms and the SSB may be transmitted a maximum of L times within the SSB burst set. A candidate position of the SSB may be predefined within the SSB burst set. A maximum number L of transmissions of the SSB may be given as follows according to a frequency band of a carrier.

For frequency range up to 3 GHz, L=4
For frequency range from 3 GHz to 6 GHz, L=8
For frequency range from 6 GHz to 52.6 GHz, L=64

The UE may perform DL synchronization acquisition (e.g., OFDM symbol/slot/half-frame boundary detection), cell identifier (ID) (e.g., physical cell identifier (PCID)) acquisition, beam arrangement for initial access, MIB acquisition, and DL measurement, based on the SSB.

A frame number to which a detected SSB belongs may be identified by system frame number (SFN) information within the PBCH and a half-frame number to which the detected SSB belongs may be identified by half-frame indication information (hereinafter, HF) within the PBCH. For example, upon detecting a PBCH including HF=0, the UE may determine that an SSB to which the PBCH belongs is contained in the first half-frame within a frame. Upon detecting a PBCH including HF=1, the UE may determine that the SSB to which the PBCH belongs is contained in the second half-frame within the frame.

SSB time location is indexed (SSB index) in ascending order in time from 0 to L−1 within the SSB burst set (i.e., half-frame). When L>4, 3 least significant bits (LSBs) out of a 6-bit SSB index may be transmitted using one of 8 different PBCH-DMRS sequences and 3 most significant bits (MSBs) out of the 6-bit SSB index may be transmitted through SSB index information included in the PBCH. When L=4, a 2-bit SSB index may be indicated using 8 PBCH-DMRS sequences. When L=4, since the 8 PBCH-DMRS sequences may indicate a total of 3 bits, one remaining bit after indicating the SSB index among the 3 bits capable of being indicated by the 8 PBCH-DMRS sequences may be used to indicate a half-frame. At 6 GHz or more, 3 bits for the SSB index in the PBCH may be used to carry 3 MSBs of the SSB index. At 6 GHz or less, since a 3-bit SSB index or a 2-bit SSB index may be identified by 3 bits signaled by the PBCH-DMRS sequences, the 3 bits for the SSB index in the PBCH may be used as reserved bits at 3 GHz or less.

Figure 14:
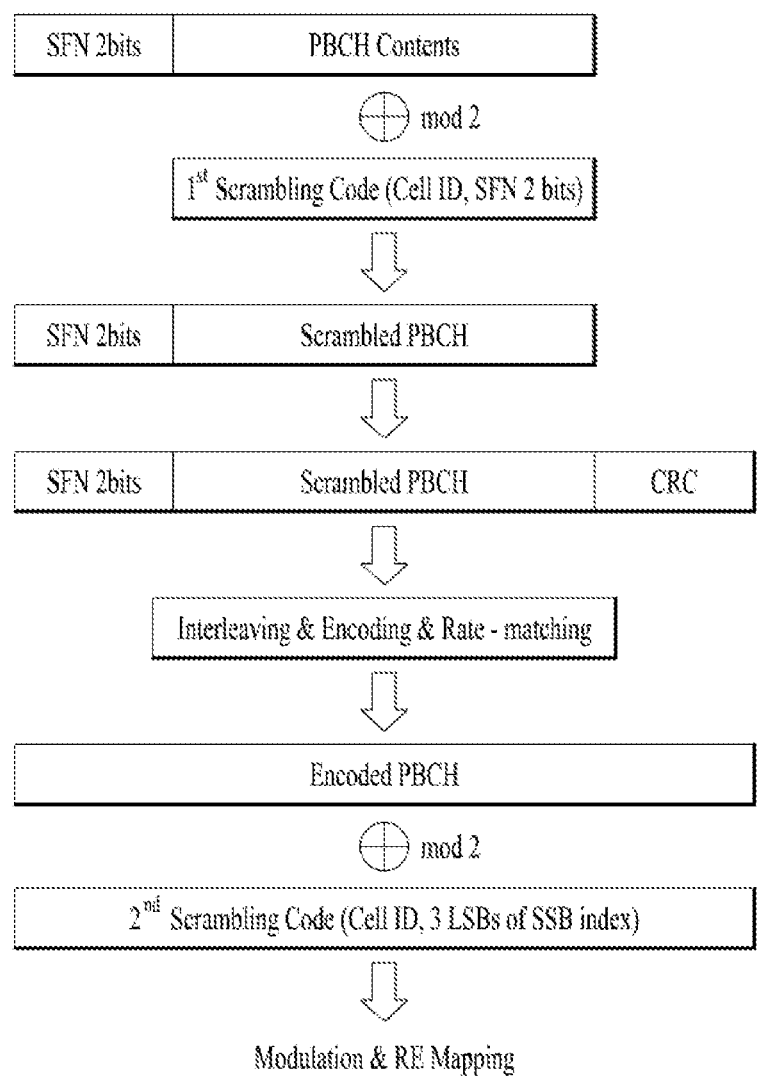
FIG. 14 illustrates a signal processing procedure for a PBCH.

FIG. 14 illustrates a signal processing procedure of a PBCH.

For PBCH transmission in a frame, PBCH content, i.e., information through the PBCH, is scrambled. The PBCH is scrambled using the first scrambling sequence and a CRC is inserted in the scrambled PBCH. The CRC-inserted PBCH is interleaved, encoded, and rate-matched, to obtain the encoded PBCH. The first scrambling sequence is a gold sequence initialized by a physical cell ID and is determined using the second and third LSBs of an SFN in which the PBCH is transmitted. The encoded PBCH is scrambled again using the second scrambling sequence. The second scrambling sequence is initialized based on the physical cell ID and 3 LSBs of an SSB index. The encoded PBCH scrambled using the second scrambling sequence is transmitted on a time-frequency resource through modulation and RE mapping, as illustrated in FIG. 13.

In the same way as in the legacy LTE/LTE-A system, the UE that desires to perform initial access to a specific cell in the NR system receives the MIB for the cell through the PBCH from the BS operating/controlling the cell and receives SIBs and radio resource control (RRC) parameters through a PDSCH. Bit fields of the PBCH may include bit(s) already known to the UE, such as SFN bits (in which an SFN is known a priori for handover cases) and reserved bits. In the NR system, Polar codes are used for channel coding of the PBCH. If already known bit(s) are well used during Polar encoding, channel coding performance may be improved. If an already known bit size (i.e., the number of known bits) is Kn, a frozen bit size becomes N−K+Kn. Herein, N is the size of a Polar code (i.e., a mother code size of Polar codes) and K is the size of input information blocks to the Polar code, i.e., the number of information bits input to the Polar code. For example, Polar encoding for information of 'K-Kn' bits is performed based on the following Polar sequence (see a Polar sequence defined in 3GPP TS 38.212 V1.0.0).

Polar Sequence

| W | I |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |

-continued

| W | I |
|---|---|
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |

| W | I |
|---|---|
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |

| W | I |
|---|---|
| 264 | 155 |
| 265 | 210 |
| 266 | 305 |
| 267 | 547 |
| 268 | 300 |
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |

| W | I |
|---|---|
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |

| W | I |
|---|---|
| 418 | 175 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |

| W | I |
|---|---|
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |

| W | I |
|---|---|
| 572 | 591 |
| 573 | 678 |
| 574 | 434 |
| 575 | 677 |
| 576 | 349 |
| 577 | 245 |
| 578 | 458 |
| 579 | 666 |
| 580 | 620 |
| 581 | 363 |
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |

| W | I |
|---|---|
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |

-continued

| W | I |
|---|---|
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |

-continued

| W | I |
|---|---|
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |

| W | I |
|---|---|
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

The above table shows a Polar sequence $Q_0^{N\ max-1}$ and a reliability $W(Q_i^{N\ max})$ of the Polar sequence. In the above table, W denotes $W(Q_i^{N\ max})$ and I denotes $Q_i^{N\ max}$. Namely, the Polar sequence $Q_0^{N\ max-1} = \{Q_0^{N\ max}, Q_1^{N\ max}, \ldots, Q_{N\ max-1}^{N\ max}\}$ is given by the above table, where $0 \leq Q_i^{N\ max} \cdot N\ max-1$ denotes a bit index before Polar encoding for $i=0, 1, \ldots, N\ max-1$ and $N\ max=1024$. The Polar sequence $Q_0^{N\ max-1}$ is ascending order of reliability $W(Q_0^{N\ max}) < W(Q_1^{N\ max}) < \ldots < W(Q_{N\ max-1}^{N\ max})$, where $W(Q_i^{N\ max})$ denotes the reliability of bit index $Q_i^{N\ max}$. For example, referring to the above table, a reliability $W(Q_i^{N\ max})=3$ of a bit index $Q_i^{N\ max}=4$ is lower than a reliability $W(Q_i^{N\ max})=7$ of bit index $Q_i^{N\ max}=3$. That is, the above table lists, in ascending order of reliability, bit indexes 0 to 1023 which respectively indicate 1024 input positions of a Polar code of N max=1024. For any information block encoded to N bits, a same Polar sequence $Q_0^{N-1}=\{Q_0^N, Q_1^N, Q_2^N, \ldots, Q_{N-1}^N\}$ is used. The Polar sequence $Q_0^{N-1}$ is a subset of Polar sequence $Q_0^{N\ max-1}$ with all elements $Q_i^{N\ max}$ of values less than N, ordered in ascending order of reliability $W(Q_0^N) < W(Q_1^N) < W(Q_2^N) < \ldots < W(Q_{N-1}^N)$. For example, when N=8, a Polar sequence $Q_0^7$ includes elements of $Q_i^{N\ max}<8$ among elements of the Polar sequence $Q_0^{N\ max-1}$ and the elements of $Q_i^{N\ max}<8$ are ordered in ascending order of reliability $W(0)<W(1)<W(2)<W(4)<W(3)<W(5)<W(6)$.

Hereinafter, the present invention will be described based on the Polar sequence $Q_0^{N\ max-1}$ given by the table of <Polar sequence>.

In spite of a known bit, the known bit may be used as information according to a moment when a radio signal is transmitted so that the known bit may become an unknown bit. For example, an SFN bit is used as a known bit only during handover. Therefore, a method of fixing K and then predetermining input positions at which known bit(s) are to be mapped to a Polar code according to the number of the known bits may be used. For example, Table 5 lists input bit positions for an information block of size K (=10) input to a Polar code in a Polar sequence of N=512.

TABLE 5

| | Polar sequence |
|---|---|
| 1 | 505 |
| 2 | 506 |
| 3 | 479 |
| 4 | 508 |
| 5 | 495 |
| 6 | 503 |
| 7 | 507 |
| 8 | 509 |
| 9 | 510 |
| 10 | 511 |

Table 5 shows 10 elements for K=10 among elements of the Polar sequence of N=512 in ascending order of reliability. Referring to the above-described table of <Polar sequence>, values of 1 having 10 reliabilities $W(Q_i^{N\ max})$ among values of I ($Q_i^{N\ max}$) less than N=512 are {479, 495, 503, 505, 506, 507, 508, 509, 510, 511}. If {479, 495, 503, 505, 506, 507, 508, 509, 510, 511} are arranged in ascending order of reliability W, {505, 506, 479, 508, 495, 503, 507, 509, 510, 511}, which is a set of bit indexes for K=10 in the Polar sequence of N=512 shown in Table 5, are obtained. Known bit(s) and/or unknown bit(s) among K=10 may be arranged in bit indexes {505, 506, 479, 508, 495, 503, 507, 509, 510, 511} according to examples of the present invention.

Although the present invention is described by giving the PBCH as an example for convenience of description, the present invention may also be applied to other channels using a data field in which known bit(s) such as a short PUCCH are included.

It is assumed that a set of bit indexes in a Polar sequence, for Kn known bit(s) regarded as frozen bits, is Fn. It was agreed that the PBCH has a payload size of 56 bits in the NR system. In consideration of this fact, method(s) (e.g. Method 1, Method 2-a, Method 2-b, Method 2-c) of the present invention to obtain Fn for the case in which K=56, N=512, M=864, and |Fn|=2 (i.e. Kn=2) are described. Herein, M is the length of an actual codeword and may be equal to a size after an encoded bit sequence is rate-matched. For example, in the NR system, M for a PBCH is 864. In the present disclosure, |S| represents the number of elements in a set S. Prior to a description of the methods and examples of the present invention, a method of obtaining 56 elements (i.e., bit indexes or input positions) for an information block of K=56 among elements of a Polar sequence of N=512 will now be described. If the method described with reference to Table 5 is applied, values of I having 56 highest reliabilities (i.e. 56 most reliable bit indexes) among values of I ($=Q_i^{N\ max}$) less than N=512 are {247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511}. If the 56 bit indexes {247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511} are arranged in ascending order of reliability W, a new Polar sequence {441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511} consisting of the 56 bit indexes is obtained. The Polar sequence {441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511} is a subset of the Polar sequence for N=512 and also is a subset for a Polar sequence for N max=1024.

Figure 15:
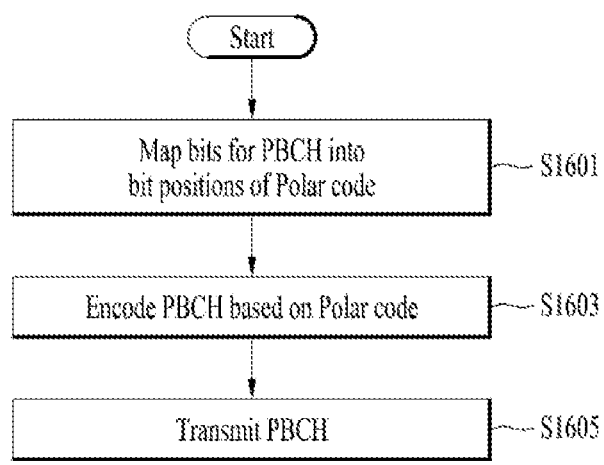
FIG. 15 illustrates a flowchart of PBCH transmission according to examples of the present invention.

FIG. 15 illustrates a flowchart of PBCH transmission according to examples of the present invention. For channel coding for a Polar code, bits for a PBCH are mapped to bit positions of the Polar code (S1601). Channel coding performance differs depending on to which bit positions of the Polar code the bits of the PBCH are mapped. In this disclosure, specific bits of the bits for the PBCH are mapped to the bit positions of the Polar code according to example(s) of the present invention. The PBCH, more specifically, the bits for the PBCH are encoded based on the Polar code (S1603). The encoded bits are transmitted over the PBCH (S1605).

A receiving device receives the PBCH and decodes the bits in the PBCH based on a mapping relationship applied in S1601. The mapping relationship may be one of the examples of the present invention described below.

Method 1. In a Polar sequence $Q_0^{N\ max-1}$, if a set of bit indexes for K among bit indexes of the Polar sequence is $Q^*_{I,K}{}^N$ and a set of bit indexes when considering Kn (i.e., a set of bit indexes for K-Kn) is $Q^*_{I,Kn}{}^N$, then a set of $Q^*_{I,K}{}^N \backslash Q^*_{I,Kn}{}^N$ is used as frozen bit(s), where A\B denotes the difference of set B from set A, i.e., A-B, and is the set of elements of set A that are not in set B. That is, for $Fn = Q^*_{I,K}{}^N \backslash Q^*_{I,Kn}{}^N$, K=56, N=512, and Kn=|Fn|=2 Fn={441, 469}. This method uses the Polar sequence $Q_0^{N\ max-1}$ shared by a transmitting device and a receiving device and may be useful when K or |Fn| is changed.

Method 2. Regardless of the Polar sequence $Q_0^{N\ max-1}$, bit(s) making a block error rate (BLER) lowest are used as frozen bit(s).

The following table lists bit error rate (BER) values when a target BLER is $10^{-2}$ in the case of K=56, N=512 and M=864.

TABLE 6

| i | BER |
| --- | --- |
| 247 | 0.00465686 |
| 253 | 0.00343137 |
| 254 | 0.00367647 |
| 255 | 0.00367647 |
| 367 | 0.00220588 |
| 375 | 0.00563726 |
| 379 | 0.00416667 |
| 381 | 0.00661765 |
| 382 | 0.00588235 |
| 383 | 0.00490196 |
| 415 | 0.0024509 |
| 431 | 0.00196078 |
| 439 | 0.0046568 |
| 441 | 0.0085784 |
| 443 | 0.0061274 |
| 444 | 0.0083333 |
| 445 | 0.0073529 |
| 446 | 0.0061274 |
| 447 | 0.0056372 |
| 463 | 0.0039215 |
| 469 | 0.0095588 |
| 470 | 0.0112745 |
| 471 | 0.0068627 |
| 473 | 0.0102941 |
| 474 | 0.010049 |
| 475 | 0.0105392 |
| 476 | 0.0112745 |
| 477 | 0.0098039 |
| 478 | 0.0095588 |
| 479 | 0.0058823 |
| 483 | 0.0085784 |
| 485 | 0.0093137 |
| 486 | 0.0115196 |
| 487 | 0.007598 |
| 489 | 0.0115196 |
| 490 | 0.0107843 |
| 491 | 0.0078431 |
| 492 | 0.0120098 |
| 493 | 0.0107843 |
| 494 | 0.0090686 |
| 495 | 0.0056372 |
| 497 | 0.007598 |
| 498 | 0.0115196 |
| 499 | 0.0112745 |
| 500 | 0.0102941 |
| 501 | 0.0090686 |
| 502 | 0.0112745 |
| 503 | 0.0093137 |
| 504 | 0.0093137 |
| 505 | 0.0120098 |
| 506 | 0.0125 |
| 507 | 0.0115196 |
| 508 | 0.0120098 |
| 509 | 0.0107843 |
| 510 | 0.0095588 |
| 511 | 0.0071078 |

Figure 16:
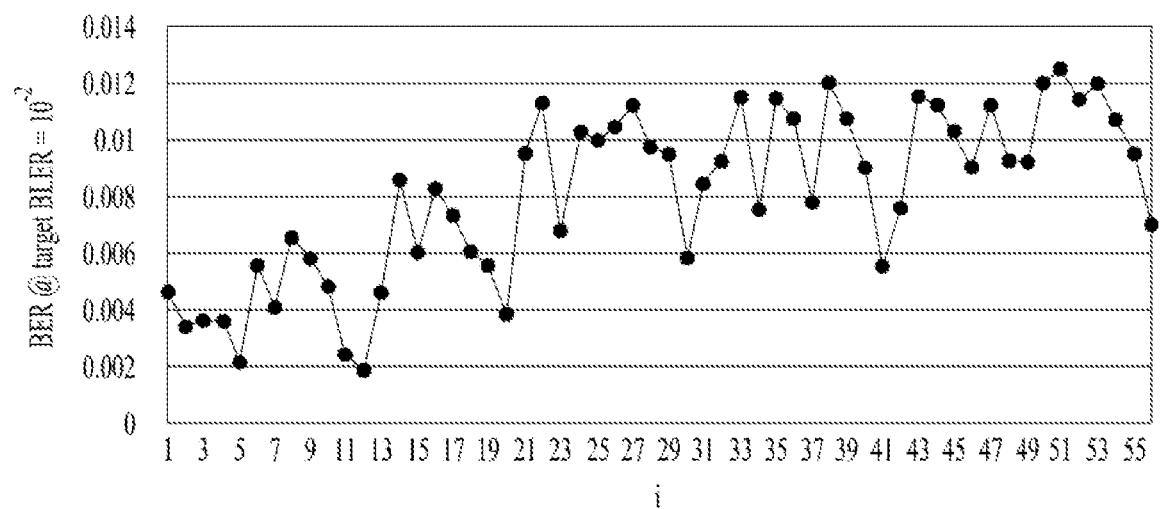
FIG. 16 illustrates bit error rate (BER) values of input bit indexes for a Polar code.

Table 6 lists the BER values according to bit indexes. FIG. 16 illustrates BER values of input bit indexes for a Polar code. In FIG. 16, i=1, 2, 3, . . . , 55, 56 are bit indexes {247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511} for K (=56) input bits and correspond to one by one to the 56 bit indexes {247, 253, 254, 255, 367, 375, 379, 381, 382, 383, 415, 431, 439, 441, 443, 444, 445, 446, 447, 463, 469, 470, 471, 473, 474, 475, 476, 477, 478, 479, 483, 485, 486, 487, 489, 490, 491, 492, 493, 494, 495, 497, 498, 499, 500, 501, 502, 503, 504, 505, 506, 507, 508, 509, 510, 511}. For example, in FIG. 16, i=1 may represent a bit index 247, i=2 may represent a bit index 253, and i=3 may represent a bit index 254.

In Method 2, a few candidate groups for Fn are exemplarily described below based on Table 6 or the BER graph of FIG. 16.

Method 2-a. Known bits are placed at positions having the worst BER performance among input positions of the polar code. BLER is mainly determined from bits having a poor BER, i.e., bits having a high BER, among error probabilities of respective bits. Therefore, if corresponding parts, i.e., input bit indexes having poor BERs, are used as the known bits, since this is like the case in which BERs in the corresponding bits become zero, BLER is improved. In Method 2-a, for example, |Fn|={508, 506}.

Method 2-b. Known bits are placed in bit indexes of which decoding order is earlier based on decoding bit order. According to Method 2-b, since the known bits are used at an early stage of decoding, BLER is improved. When the UE decodes only an SSB index of a neighbor cell although the SSB index is not a known bit, i.e., when the UE preferentially decodes only some bits, an unknown bit may first be mapped to a bit position having fast decoding order. In other words, when it is desired to cause the receiving device to decode only an index of a neighbor cell such as an SSB index although the SSB index is not a known bit or when it is desired to cause the receiving device to preferentially decode only partial bits, Fn may be determined such that an unknown bit may first be decoded in decoding bit order. As mentioned above, in the Polar code, generally, decoding is sequentially performed starting from a low bit index among encoder input bit indexes (i.e., bit indexes before Polar encoding). Therefore, referring to bit indexes {441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511} for K=56 among bit indexes of a Polar code of N=512 and the BER of FIG. 16, |Fn| lowest bit indexes may be selected from among bit indexes in a corresponding polar sequence. In Method 2-b, for example, |Fn|={247, 253}.

Method 2-c. Known bits are placed at positions which greatly affect error propagation. For example, in Method 2-c, known bit(s) are placed in bit index(es) having poor BERs among bit indexes of which decoding order is early among bit indexes of the Polar code. Generally, since decoding order of the front part of the Polar code, i.e., decoding order of low bit indexes, is earlier than decoding order of the rear part of the Polar code, i.e., decoding order of high bit indexes, a bit position having a poor BER (i.e., a bit position having a high BER) among bit positions of the front part of the Polar code may be replaced with a known bit. Since the Polar code uses successive decoding, if an error occurs in a decoding bit, an error is propagated to rear decoding bit(s) of the decoding bit in which the error occurs, thereby increasing the BER. Since, in Method 2-a, the known bit is mapped to a bit position having the poorest BER among K bit positions, decoding for the known bit is performed too late if a bit index of a bit position having a poor BER is high so that it is difficult to reduce error propagation. In contrast, according to Method 2-c, the BLER may be improved by reducing an initially generated error probability. Fn may differ according to the size of known bits, i.e., the number of known bits. However, if known bits are allocated to input bit indexes of a part at which decoding is performed early, the BLER may be optimized. Optimal bit setting, i.e., optimal Fn, may be searched by a combination of indexes within input indexes (i.e., bit indexes) of a part at which decoding is early performed relative to other parts, i.e., a part at which a decoding order is early or by a combination of indexes which simultaneously considers the input indexes of the part at which decoding is early performed relative to other parts and Method 2-a. Referring to Table 6 and FIG. 17, in Method 2-c, for example, |Fn|={469, 375}. Referring to Table 6 or FIG. 16, although bit index 375 has a higher BER than bit indexes 367 and 379 and bit index 469 has a higher BER than bit indexes 463 and 470, BERs of bit indexes 375 and 469 becomes 0 if known bits are placed in bit indexes 375 and 469. Therefore, error propagation of bit indexes 375 and 469 may be reduced.

Table 7 shows performance of sets of known bits for Method 1, Method 2-a, Method 2-b, and Method 2-c. In other words, Table 7 shows BLERs for Fn described in Method 1, Method 2-a, Method 2-b, and Method 2-c. BLER_1, BLER_2, BLER_3, and BLER_4 represent BLERs for Method 1, Method 2-a, Method 2-b, and Method 2-c, respectively. Particularly, Table 7 shows respective BLERs when SNR=−9 dB, −8.5 dB, −8 dB, and −7.5.

TABLE 7

| SNR [dB] | BLER_1 | BLER_2 | BLER_3 | BLER_4 |
|---|---|---|---|---|
| −9 | 0.170068 | 0.22779 | 0.197238 | 0.16488 |
| −8.5 | 0.060368 | 0.082372 | 0.065638 | 0.05777 |
| −8 | 0.01574 | 0.024251 | 0.018002 | 0.015019 |
| −7.5 | 0.003189 | 0.005385 | 0.003241 | 0.00305 |

Referring to Table 7, BLER_1 and BLER_4 entirely exhibit good performance in the PBCH. Accordingly, Method 1 or Method 2-c may be selected to determine input positions to the Polar code for bits of the PBCH. When K or known bits other than the PBCH vary, one of all the aforementioned methods may be selected to determine to which position of input positions to the Polar code corresponding information is input.

The length of known bits, i.e., the number of known bits, may differ according to transmission timing. For example, an SFN is used as a known bit only in the case of handover. In this way, when the number of known bits differs according to transmission timing or transmission situation, an example of the present invention may separately use Fn into multiple subsets. For example, in the case of the PBCH, if a subset for reserved bits is Fn_1 and a subset for SFN bits is Fn_2, then Fn is a union of Fn_1 and Fn_2 (Fn=Fn_1 U Fn_2) and |Fn|=|Fn_1|+|Fn_2|. When determining Fn, it is possible to discover a subset Fn_i having good performance in units of a subset size. For example, if a subset for reserved bits is Fn_1, since the reserved bits have a high possibility of being used as the known bits, Fn_1 may be determined first and then Fn_2 may be determined. That is, when configuring Fn, it is possible to search for good performance in units of a subset size. For example, when a subset for 2 reserved bits is Fn_1, then Fn_1 for the 2 reserved bits may be determined first and then Fn_2 including Fn_1 may be determined.

Alternatively, Fn may be configured in order of Fn_1, Fn_2, Fn_3, . . . , by regarding the unit of a subset size as one bit, e.g., by regarding |Fn_i|=1. Fn may be configured in such a way that Fn_2 including Fn_1 is determined and Fn_3 including Fn_2 is determined. In this method, Fn may be sequentially selected starting from Fn_1 according to the size of known bits determined at a transmission timing of corresponding information regardless of how many times a subset is used. For example, if Fn_1 is configured to be used when an SFN is used as a known bit and Fn_2 is configured to be used when the SFN is used as an unknown bit, then Fn may be selected according to the size of the known bit even if the SFN is frequently transmitted as the known bit. For example, Fn_4 may be used to transmit information corresponding to 4 known bits and Fn_1 may be used to transmit information corresponding one known bit.

In the case of the PBCH, even when distributed CRC is applied to the PBCH, it may be difficult to use early termination for an unknown bit in a decoding procedure due to a false alarm rate (FAR). Therefore, unknown bit(s) may be mapped to some of bit indexes other than Fn. However, for example, when a receiving device can decode and use only a specific part (e.g., SSB index) without considering the FAR, known bit(s) may be mapped as in Method 2-b. Meanwhile, if a method of lowering an FAR of a corresponding part through a minimum of 1-bit CRC is used, SSB indexes may be mapped in order of lowest BER among input indexes connected to a corresponding CRC part. For example, when the receiving device separately decodes only the SSB index and performs CRC using a minimum of 1-bit CRC with respect to the decoded SSB index, the SSB index may be mapped to 3 bit indexes having the lowest BER among bit indexes connected to a minimum of 1-bit CRC.

Hereinafter, the present invention will be described by taking bit fields of the PBCH as an example.

Table 8 lists information fields of the PBCH considered in the NR system. Although there are some fields in which the length of each bit field of the PBCH used for the NR system is not specified, examples of the present invention will be described below using types which are frequently mentioned in an NR standardization process for convenience of description. For example, the examples of the present invention are described with reference to Table 8. The length of bits of each bit field of the PBCH, i.e., the number of bits of each bit field, may be different from that shown in Table 8.

TABLE 8

| Parameter | Number of bits |
|---|---|
| System frame number (SFN) | 10 |
| Half-frame (HF) timing | 1 |
| SSB location index | 3 |
| Configuration for CORESET for RMSI scheduling | 8 |
| RAN2 | 3 |
| Offset between SSB frequency domain location and physical resource block (PRB) grid in resource element (RE) level | 4 |
| Downlink numerology to be used for RMSI, msg2/msg4 for initial access and broadcasted other system information (OSI) | 1 |
| Indication of the 1$^{st}$ demodulation reference signal (DMRS) position | 1 |
| Spare | 1 |
| CRC | 24 |
| Total | 56 |

A payload of the PBCH may include information shown in Table 8. In a 56-bit payload for the PBCH, 10 bits are included in an MIB, 8 bits are included in a PBCH transport block, and 24 bits are CRC bits. In Table 8, "SFN" denotes a system frame number in which the PBCH is transmitted, "Half-frame timing" denotes half-frame indication information (hereinafter, HF) indicating whether a half-frame to which the PBCH belongs is the first half-frame or the second half-frame, "SSB location index" denotes information about 3 MSBs of an SSB index to which the PBCH belongs, and "Configuration for CORESET for RMSI scheduling" denotes configuration information about a control resource set (CORESET), which is a resource set on which a PDCCH carrying scheduling information about remaining system information (RMSI) except for the MIB (or RMSI except for the MIB and SIB1) is capable of being monitored by the UE. "RAN2" denotes information included in the PBCH based on a request of a work group related to a RAN2 layer among NR standardization related working groups. For example, information through which whether the UE can camp on a cell in which the PBCH is transmitted can be rapidly identified is "RAN2" which may be included in the PBCH. For example, frequency on/off related information indicating whether a corresponding frequency in which the PBCH is transmitted is in an on or off state and cell on/off related information indicating whether a corresponding cell in which the PBCH is transmitted is in an on or off state may be included in "RAN2". "Offset between SSB frequency domain location and physical resource block (PRB) grid in resource element (RE) level" represents frequency offset related information (hereinafter, PRB offset) for aligning an SSB and a PRB in the frequency domain when a PRB grid for the SSB is not aligned with a PRB grid for the CRB. For example, the PRB offset information may be information about a subcarrier offset from subcarrier 0 in the CRB to subcarrier 0 of the SSB and may be given as an RE level (e.g., the number of subcarriers). "Downlink numerology to be used for RMSI, msg2/msg4 for initial access and broadcasted other system information (OSI)" represents information about numerology (e.g., subcarrier spacing) available for, for example, an RMSI CORESET, DL transmission of an RACH procedure, and other SI information.

In the information of the PBCH, the SFN, the HF, and the SSB index are timing information and are conveyed through a PBCH transport block. For example, the 1-bit HF, 4 LSBs of the 10-bit SFN, and 3 MSBs of the SSB index are conveyed through the PBCH transport block. 6 MSBs of the 10-bit SFN may be included in the MIB. In the case of an SSB transmitted in a frequency band of 6 GHz or more, 3 LSBs of the SSB index are not transmitted through the payload of the PBCH and may be provided through a PBCH-DMRS sequence in each half-frame. In the case of an SSB transmitted in a frequency band of 6 GHz or less, some or all of 3 bits used for the SSB index in the PBCH may be used as reserved bits.

For performance improvement of Polar codes, although known bits should be mapped to input positions having low reliabilities, a field type constituting the known bits may differ according to a PBCH transmission situation. For example, known bits for the PBCH may differ as follows.

Example 1

In an initial access stage, all bits of the PBCH may be unknown bits.

Example 2

As described earlier, SFN bits may be known bits (e.g., an SFN is known a priori for handover cases).

Example 3

In a target cell of the handover or a non-stand alone (NSA) cell which shall be configured together with another serving cell, since system information is provided to the UE through another serving cell or a primary carrier (e.g., which is an LTE cell), information such as frequency on/off, cell on/off, and CORESET may be known bit(s).

Example 4

Frequency band on/off information in a measurement stage may be a known bit indicating "on".

Example 5

Assuming that synchronization is matched, it may be assumed that the SFN, the HF timing (i.e., HF indicator) (hereinafter, HF), and SSB index information are the same as those in a cell. For reference, if time synchronization of a serving cell and a target cell (e.g., a difference between time when the UE receives a signal transmitted by the serving cell and time when the UE receives a signal transmitted by the target cell) is a value within a predetermined range (e.g., 33 μs, 3 us, or min(two SSB OFDM symbols, one data OFDM symbol)), this may represent that synchronization between the serving cell and the target cell is matched. That is, the SFN, the HF, and the SSB index may be used as known bits. Although it may be assumed that frame information or half-frame information in the PBCH is the same as that in the serving cell if synchronization of the serving cell and synchronization of a cell having the PBCH (hereinafter, a target cell) match to only a certain degree according to accuracy of synchronization (at a frame level, a half-frame level, a subframe level, a slot level, and/or an OFDM symbol level), synchronization of the serving cell and synchronization of the target cell should be accurately matched in order to assume that the SSB index is equal to that in the serving cell. Therefore, it may be difficult to assume in fact that the SSB index of the serving cell is equal in synchronization to the SSB index of the target cell. For example, when a synchronization condition (e.g. the condition that UE and/or BS consider that time synchronization of two cells is consistent) is a frame granularity of ½, only the SFN may be known bits and, when the synchronization condition is a frame granularity of ¼, only the SFN and the HF may be known bits. When the synchronization condition is two slots (i.e., 0.25 ms) having a granularity of a subcarrier spacing of 120 kHz at 6 GHz or more, the 3-bit SSB index may be known bits.

Known bits may vary according to a transmission frequency as well as a transmission situation of the PBCH. For example, in a PBCH-DMRS which may carry 3-bit information, 2 bits among 3 bits indicated by the PBCH-DMRS may be used to indicate an SSB index at 3 GHz and the other one bit may be used to indicate the HF at 3 GHz. Therefore, the HF may be used as a known bit at 3 GHz or less.

The SSB index may operate as reserved bits. When the SSB index operates as the reserved bits, the UE may not interpret the corresponding bits. For example, bits used as the SSB index information in a PBCH transmitted in a frequency band of 6 GHz or more may operate as the reserved bits in a PBCH transmitted in a frequency band of 6 GHz or less. In this case, if the reserved bits are regarded as known bits, the SSB index may be used as the known bits. However, the SSB index may be regarded as unknown bits due to the possibility that the SSB index will be used as bits to support a specific function in the future.

Hereinafter, examples of Polar code input positions for the PBCH will be described in consideration of PBCH fields having the possibility of being used as known bits among the fields of the PBCH.

Field position example 1: Known bits may be mapped to input positions having low reliabilities in order of the SFN, the HF, and the known SSB index. The second and third LSBs of the SFN are used as a seed of the first scrambled sequence, the SFN may be first mapped to bit positions having low reliabilities such that the second and third LSBs of the SFN are not subject to scrambling. Alternatively, the SFN may be first mapped in order of probabilistically best-matched synchronization, and the HF and the known SSB indexes are mapped in order of probabilistically next best-matched synchronization. In other words, since an SFN of a cell in which a PBCH is transmitted has a high probability of being matched with an SFN of a serving cell, the SFN among the SFN, the HF, and the known SSB index is first mapped to bit positions having low reliabilities. For example, if the SFN is 10 bits, the HF is one bit, and the known SSB index is 3 bits, the SFN is mapped to 10 input positions having the lowest reliabilities among 56 input positions to which a 56-bit payload of the PBCH can be mapped, the HF is mapped to an input position having the 11th lowest reliability, and the known SSB index is mapped to input positions having the 12th to 14th lowest reliabilities.

Field position example 2: Known bits are mapped in order of the SFN and the HF. In field position example 1, when an SSB index field is used as reserved bits, bits of the SSB index field are mapped to input positions of a Polar code by regarding the bits of the SSB index field as unknown bits.

Field position example 3: Known bits may be mapped to input positions having low reliabilities in the order of the SFN, the HF, the known SSB index, the frequency on/off bit, the cell on/off bit, and the CORESET, based on field position example 1 or in the order of the SFN, the HF, the frequency on/off bit, the cell on/off bit, and the CORESET, based on field position example 2. Fields of the PBCH are mapped to input positions having low reliabilities among the input positions of the Polar code in the order of fields having the possibility of becoming known bits from a field having the highest possibility to a field having lowest possibility. In some cases, the possibility of becoming known bits may vary in the order of the frequency on/off bit, the SFN, the HF, and the CORESET.

Field position example 4: Field(s) of known bits among the fields of the PBCH may be mapped to the input positions of the Polar code for the PBCH in the form in which a part (e.g., frequency on/off bit) of the RAN2 bits is inserted among the second and third LSBs of the SFN, the HF, the other bits of the SFN, and the known SSB index or among the second and third LSBs of the SFN, the HF, and the other bits of the SFN. For example, known bits may be mapped to input positions having low reliabilities in the order of the second and third LSBs of the SFN, a part (e.g., frequency on/off bit) of the RAN2 bits, the HF, other bits of the SFN, and the like.

In field position example 1, field position example 2, field position example 3, and field position example 4, a mapping order of PBCH fields having the possibility of becoming known bits has been described. In other words, relative input positions of the Polar code between information types in the PBCH payload have been described in field position examples 1 to 4. However, the fields of the PBCH may be mapped to the input positions of the Polar code by various combinations according to the probability that known bits will occur in addition to the mapping order described in field position example 1, field position example 2, field position example 3, and field position example 4. The fields of the PBCH may also be mapped by two or more combinations of the mapping order described in field position example 1, field position example 2, field position example 3, and field position example 4.

Hereinafter, bit positions of known bits and unknown bits according to examples of the present invention will be described in detail. In the following examples, one or more fields capable of being known bits in the payload of the PBCH may be placed in bit indexes of the Polar code in a specific order, for improvement in PBCH decoder performance/latency.

Bit position example 1: The SSB index information may be placed at input positions having an early decoding order among the input positions of the Polar code for the PBCH. If the UE feeds back a reference signal received power (RSRP) by decoding an unknown SSB index, the UE may need not decode bits other than the unknown SSB index. Accordingly, the SSB index may be mapped to positions at which decoding is performed earliest (refer to Method 2-b). However, if an SSB index field used as reserved bits is present at a position at which decoding is performed earliest, there is a disadvantage of worsening BLER performance. Therefore, the SSB index may be placed at positions having an early decoding order among positions other than positions used for known bits. For example, when a total of 11 known bits is used for the SFN and the HF, referring to bit indexes {441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511} for K=56 among bit indexes of the Polar code for N=512, eleven positions having the lowest reliabilities are placed in order of: {441, 469, 247, 367, 253, 375, 444, 470, 483, 415, 485}. 3 bit indexes having an early decoding order except for {441, 469, 247, 367, 253, 375, 444, 470, 483, 415, 485}, i.e., 3 smallest bit indexes among bit indexes except for {441, 469, 247, 367, 253, 375, 444, 470, 483, 415, 485}, are as follows: {254, 255, 379}.

Bit position example 2: The SSB index information may be placed at input positions having an early decoding order among the input positions of the Polar code for the PBCH and the other information may be placed at positions except for the positions at which the SSB index information is placed. In other words, the unknown SSB index may be preferentially mapped to input positions having an early decoding order and other known bits may be mapped to bit positions except for the bit positions to which the unknown SSB index is mapped. For example, the unknown SSB index is mapped to smallest bit indexes {247, 253, 254} from {441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511} which are obtained by sequentially arranging 56 bit indexes, to which the payload of the PBCH may be mapped, in the ascending order of reliability, the second and third LSBs of the SFN may be mapped to two bit indexes {441, 469} having lowest reliabilities, and the other bits of the SFN except for the second and third LSBs of the SFN may be mapped to 8 bit indexes {367, 375, 444, 470, 483, 415, 485, 473} having the lowest reliabilities among bit indexes except for the bit indexes to which the unknown SSB index and the second and third LSBs of the SFN are mapped. One bit of the HF and one bit (e.g., frequency on/off related bit) of the RAN2 bits may be mapped in order of the next reliability. For example, one bit of the HF and one frequency on/off related bit may be mapped to two bit indexes having low reliabilities among bit indexes except for the bit indexes to which the unknown SSB index and the SFN are mapped. Referring to {441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511} obtained by arranging the 56 bit indexes, to which the payload of the PBCH may be mapped, in the ascending order of reliability, the HF and one bit of the RAN2 bits may be sequentially mapped to bit indexes {474, 379} next to the last bit index '473' used for the SFN. Alternatively, it is possible to sequentially map the HF and one bit of the RAN bits to {379, 474} according to probability of becoming a known bit (e.g., when the probability that one of the RAN2 bits becomes a known bit is higher than the probability that the HF becomes the known bit). Alternatively, one bit of the HF and the frequency on/off related bit, i.e., one HF bit or one frequency on/off related bit, may be mapped to a position next to the unknown SSB index in decoding order. For example, one of the HF and the frequency on/off related bit is mapped to a bit index {255} having the earliest decoding order except for bit indexes {247, 253, 254} to which the SSB index information is mapped and the other one bit of the HF and the frequency on/off related bit may be mapped to {474} having the lowest reliability among bit indexes except for {247, 253, 254}, {255}, and {367, 375, 444, 470, 483, 415, 485, 473} for the SFN. Next, the other known bits may be mapped in order of low reliability (i.e., from a bit index having a low reliability to a bit index having a high reliability) and then unknown bits are mapped to bit indexes from a bit index having a low reliability to a bit index having a high reliability. For example, the other bits of the RAN2, the cell on/off bit, and CORESET bit fields are mapped to bit indexes from a bit index having a low reliability to a bit index having a high reliability Bit position example 3: The SSB index information may be placed at 3 bit positions among input positions {247, 253, 254, 255} having an early decoding order among the bit positions of the Polar coder for the PBCH and the HF or one bit (e.g., frequency on/off related information) of the RAN2 information may be placed at a bit position at which the SSB index information is not placed among {247, 253, 254, 255}. For example, as in bit position example 2, 3 bits from the front part among {247, 253, 254, 255} having an earlier decoding order may be selected for the SSB index. Alternatively, {253, 254, 255} may be selected in order of a low BER (refer to Table 6 or FIG. 16) in consideration of the case in which the UE decodes the SSB index and use it without CRC-CHECK. When an unknown SSB index is mapped to {253, 254, 255}, it is easy to implement mapping because the unknown SSB index is mapped to successive bit positions. This is because, if the SSB index is mapped to successive bit positions, successive memory addresses may be used for the SSB index and, therefore, a reading/writing operation is facilitated to easily implement encoding/decoding. The position of the SFN is the same as that in bit position example 2 and the HF bit and the frequency on/off related bit may be mapped to {247} and {474}, respectively. Alternatively, the position of the SFN may be the same as that in bit position example 2 and the HF bit and the frequency on/off related bit may be mapped to {474} and {247}, respectively. Alternatively, the second and third LSBs of the SFN may be placed at {441, 469} and the other bits of the SFN may be placed at {247, 367, 375, 444, 470, 483, 415, 485}. One bit of the HF and one bit (e.g., frequency on/off related bit) of the RAN2 bits may be placed at {473, 474} or {474, 473}.

When the Polar code of N=512 is divided into a length-256 upper sub-code and a length-256 lower sub-code, bit indexes belonging to the upper sub-code are only {247, 253, 254, 255} among 56 bit indexes {441, 469, 247, 367, 253, 375, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 501, 447, 505, 506, 479, 508, 495, 503, 507, 509, 510, 511} and the other bit indexes belong to the lower sub-code. As mentioned previously, generally, since a decoder of the Polar code is designed to perform decoding from an upper row to a lower row of the Polar code, the upper sub-code is decoded earlier than the lower sub-code. Therefore, if the SSB index and/or the HF, or the SSB index and/or the RAN2 bit are placed at {247, 253, 254, 255}, a receiving device may decode the SSB index and/or the HF, or the SSB index and/or the RAN2 bit mapped to {247, 253, 254, 255} earlier than other information. In this case, a device requiring only the SSB index and/or the HF and a device requiring the SSB index and/or the RAN2 bit may terminate or complete decoding of the PBCH faster than the case in which the SSB index and/or the HF, or the SSB index and/or the RAN2 bit are mapped to other bit indexes.

In the case of bit position example 2 in which the SSB index is mapped to {247, 253, 254} and the HF or the RAN2 bit is mapped to {255}, if the decoder desires to complete decoding of the HF (or RAN2 bit), the decoder should perform decoding for bit indexes 248, 249, . . . , 254 starting from 247. In contrast, in the case of bit position example 3 in which the SSB index is mapped to {253, 254, 255} and the HF or the RAN2 bit is mapped to {247}, if {247} is decoded, the HF or the RAN2 bit may be obtained.

In bit position example 1, bit position example 2, and bit position example 3, although the SSB index information, SSB information and HF information, or SSB information and RAN2 information have been described as PBCH parameters having a fast decoding order, it is possible to place PBCH parameters other than the SSB index information, HF information, and/or RAN2 information at bit positions of the Polar code in consideration of decoding order.

Figure 17:
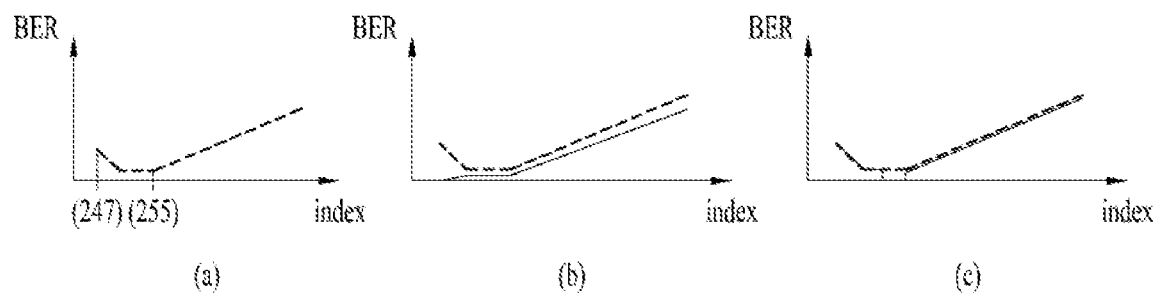
FIG. 17 illustrates comparison of performance between bit positions exemplified in the present disclosure.

FIG. 17 illustrates comparison of performance between bit positions exemplified in the present disclosure. FIG. 17(a) is a graph illustrating BERs of 56 information bits, FIG. 17(b) is a graph illustrating BERs when HF is a known bit and the HF is mapped to bit index {247}, and FIG. 17(c) is a graph illustrating BERs when HF is a known bit and the HF is mapped to bit index {255}.

As mentioned previously, HF may be or may not be a known value and an SSB index may be or may not be a known value. If only the HF is a known value and the SSB index is not a known value, the SSB index should be decoded by a receiving device.

Referring to FIG. 17(b), if the HF is a known value, the SSB index is not a known value, the HF is placed in bit index {247}, and the SSB index is placed in bit indexes {253, 254, 255}, since the bit index having the earliest decoding order has been used for the known bit, there is advantage of most effectively preventing error propagation in a decoding process. For example, BER performance in the example of FIG. 17(b) becomes better than BER performance illustrated in FIG. 17(a) by an influence of bit index {247} having BER=0 due to an SC decoding characteristic in which decoding of indexes is performed in (nearly) ascending order. For a similar reason, improved BERs of 4 bits placed in bit indexes {247, 253, 254, 255} have an effect on BER performance of bits placed in other bit indexes so that entire BER performance of the 56 information bits can be improved.

Referring to FIG. 17(c), if the HF is a known value, the SSB index is not a known value, the HF is placed in bit index {255}, and the SSB index is placed in bit indexes {247, 253, 254}, a BER of bit index {255} in which the HF known to the UE is placed is 0 but BERs of {247, 253, 254} are almost similar to BERs of FIG. 17(a). In the example of FIG. 17(c), although BER performance is slightly improved by sequential decoding, the HF affects only bit index {255} so that a degree of improvement in BER performance is lowered as compared with FIG. 17(b).

Meanwhile, if the SSB index is a known value and the HF is an unknown value, the HF should be decoded by the receiving device. If the HF is placed in bit index {247}, the receiving device may identify the value of this HF more quickly as compared with the case in which the HF is placed in bit index {255}.

Figure 18:
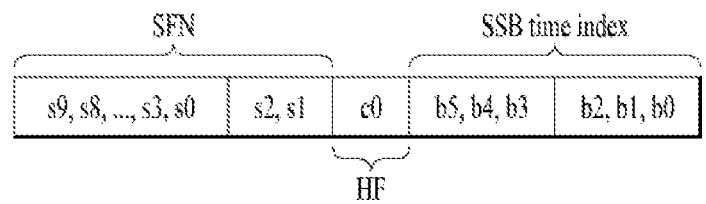
FIG. 18 illustrates timing information bit fields included in a synchronization signal and PBCH block (SSB).

FIG. 18 illustrates timing information bit fields included in an SSB.

Some bits among 3 bits used for an SSB index in a PBCH may be used for a specific usage. For example, since 3 bits of an unknown SSB index field may operate as reserved bits at 6 GHz or less, a part of the 3 bits used for the SSB index information at 6 GHz or more may be used as other information at 6 GHz or less. For example, one of the 3 bits used for the SSB index at 6 GHz or more may be used for PRB offset information at 6 GHz or less. If one of the 3 bits used for the SSB index at 6 GHz or more is used for the PRB offset information at 6 GHz or less, the PRB off information may indicate a total of 32 values by 4 bits for the PRB offset information of Table 8 and one reserved bit at below 6 GHz. For example, if an unknown SSB index is placed at {253, 254, 255} among the bit positions of the Polar code, b3, b4, and b5, which are 3 MSBs of the SSB index in FIG. 18, may be mapped to {253, 254, 255} in order of b3, b4, and b5 at 6 GHz or more. A part of b3, b4, and b5 at 6 GHz or less may be used for a specific usage. For example, a part of b3, b4, and b5 at 6 GHz or less may be selected for information of specific usage (hereinafter, specific information).

Selection of one bit:
  Reserved bit use example 1-1: A bit mapped to {253} having the earliest decoding order, i.e., b3, may be selected.
  Reserved bit use example 1-2: Specific information may be placed at {254} or {255}. In this case, specific information of a length-256 upper sub-code and a length-256 lower sub-code in a length-512 Polar code is placed at one of the last two bits of the upper sub-code. When a reserved bit may be regarded as a known bit, if {254} is regarded as the known bit, a bit of {254} may not be re-encoded. Therefore, if the bit b4 (i.e., {254}) or the bit b5 (i.e., {255}) is used for the specific usage, least complexity may be obtained.
Selection of two bits:
  Reserved bit use example 2-1: The bits b3 and b4 mapped to {253, 254} having an early decoding order may be selected.
  Reserved bit use example 2-2: Referring to FIG. 8 for example, a decoding operation method for odd terms u1, u3, u5, and u7 among u1 to u8 is different from a decoding operation method for even terms u2, u4, u6, and u8 among u1 to u8. In consideration of this point, the bits b3 and b5 placed at lower positions among the last 4 bit positions of an upper sub-code for which a decoder can perform the same operation may be selected.
  Reserved bit use example 2-3: The bits b4 and b5 having the least decoding complexity may be selected among {253, 254, 255}.
Selection of 3 bits: All of the bits b3, b4, and b5 are used for the specific information when 3 bits are used for the specific information.

In order for a part among the bits b3, b4, and b5 to perform a specific role, the positions of b3, b4, and b5 may be changed within bit indexes {253, 254, 255} for an unknown SSB index.

Case in which b3 performs a specific role:
  Reserved bit use example 3-1: b3 may be placed at {253}. Since {253} is the position of b3, b3 is mapped to {253} without change in position.
  Reserved bit use example 3-2: For the same reason as reserved bit use example 1-2, b3 may be placed at {254} or {255}.

Similarly, if b4 or b5 performs a specific role, b4 or b5 may be placed at {253}, {254}, or {255} as in reserved bit use example 3-1 and reserved bit use example 3-2.

As in reserved bit use example 3-1, when the position of a bit performing a specific role is the same as an original position, the other bits may maintain the same positions. However, as in reserved bit use example 3-2, if the position of the bit performing a specific role is different from the original position, positions of the other bit(s) may be determined as follows.

Reserved bit use example 4-1: Among the bits b3, b4, and b5 of the SSB index, a bit which has been placed at a bit index at which a bit performing a specific role is to be placed is placed at a bit index at which the bit performing the specific role has been placed. For example, when b3 is a bit performing a specific role and b3 is desired to be placed at {254}, b4 which has been placed at {254} is placed at {253} which is an original position of b3. Therefore, bit indexes of b4, b3, and b5 are {253, 254, 255}.

Reserved bit use example 4-2: The bits b3, b4, and b5 of the SSB index may be shifted using a cyclic shifter from an original position of a bit performing a specific role to a position to be changed. For example, when b3 is a bit performing a specific role and b3 is desired to be placed at {254}, bit positions of the Polar code for b5, b3, and b4 are placed at {253, 254, 255} if a right shifter is used.

When two bits simultaneously perform a specific role, for example, when b3 and b4 perform a specific role, bit indexes may be selected as follows.

Reserved bit use example 5-1: b3 and b4 may be placed at {253, 254} which are original positions. Alternatively, b3 and b4 may be placed at {253, 254} having a fast decoding order.

Reserved bit use example 5-2: b3 and b4 may be placed at {253, 255} placed at lower positions among the last 4 bit positions of an upper sub-code, where the last 4 bit positions are bit positions for which the decoder can perform the same operation or calculation.

Reserved bit use example 5-3: Since {254, 255} are the last two bit positions of a length-256 upper sub-code of the length-512 Polar code and thus have least complexity, b3 and b4 may be placed at {254, 255}.

In reserved bit use examples 5-1, 5-2, and 5-3, positions at which two bits are placed may be interchanged. For example, b3 and b4 may be mapped to {253, 254} or {254, 255}. For a similar reason, when b3 and b5 or b4 and b5 perform a specific role, those bits may be placed at bit positions of the Polar code as in the reserved bit use examples 5-1, 5-2, and 5-3.

When positions of two bits performing a specific role are same as original positions, positions of the other bits are identically maintained. However, if two bits performing a specific role are different from original positions, positions of the other bits (e.g., bit indexes) may be determined as follows.

Reserved bit use example 6-1: Among the bits b3, b4, and b5 of the SSB index, bits which have been placed at bit indexes at which bits performing a specific role are to be placed are placed at bit indexes at which the bits performing a specific role have been placed. For example, if b3 and b5 perform a specific role and are desired to be placed at {253, 254}, the bit placed at {253} is mapped to {253} which is the same bit position as an original bit position and b5 which has been placed at {255} is placed at {254} which is an original bit position of b4. Then, the positions of b3, b5, and b4 are {253, 254, 255}.

If a cyclic shifter is used without using bit position exchange (refer to the reserved bit use example 6-1) of each bit, b3, b4, and b5 may be placed at bit positions of the Polar code as in the reserved bit use examples 5-1, 5-2, and 5-3. For example, when a right cyclic shifter is used, b3, b4, and b5, b5, b3, and b4, or b4, b5, and b3 may be placed at {253, 254, 255}.

When two or more bits simultaneously perform a specific role, a method of directly exchanging bit positions as in reserved bit use example 4-1 and the reserved bit use example 6-1 and a method of using the cyclic shifter as in the reserved bit use examples 5-1, 5-2, and 5-3 may be simultaneously applied so that b3, b4, and b5 may be mapped to desired bit positions. Since the bit positions are positions for the input bits of the Polar code, in the case of uplink control information (UCI), the bits illustrated in FIG. 18 may be placed at the bit positions of the Polar code in consideration of an interleaver effect caused by distributed CRC. For example, if bits input to the second, third, and fifth input bit positions among input bit positions of a distributed-CRC interleaver are configured to be mapped to bit indexes {253, 254, 255} of the Polar code, then b3, b4, and b5 are placed at the second, third, and fifth input bit positions of a front part of the distributed-CRC interleaver.

Figure 19:
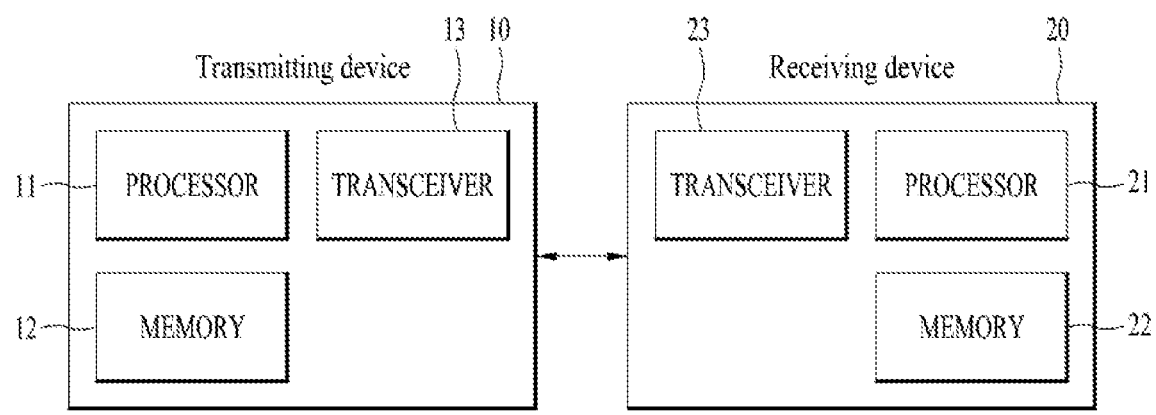
FIG. 19 is a block diagram illustrating elements of a transmitting device 10 and a receiving device 20 for implementing the present invention.

FIG. 19 is a block diagram illustrating elements of a transmitting device 10 and a receiving device 20 for implementing the present invention.

The transmitting device 10 and the receiving device 20 respectively include transceivers 13 and 23 capable of transmitting and receiving radio signals carrying information, data, signals, and/or messages, memories 12 and 22 for storing information related to communication in a wireless communication system, and processors 11 and 21 operationally connected to elements such as the transceivers 13 and 23 and the memories 12 and 22 to control the elements and configured to control the memories 12 and 22 and/or the transceivers 13 and 23 so that a corresponding device may perform at least one of the above-described examples of the present invention. The transceivers may also be referred to as radio frequency (RF) units.

The memories 12 and 22 may store programs for processing and controlling the processors 11 and 21 and may temporarily store input/output information. The memories 12 and 22 may be used as buffers.

The processors 11 and 21 generally control the overall operation of various modules in the transmitting device and the receiving device. Especially, the processors 11 and 21 may perform various control functions to implement the present invention. The processors 11 and 21 may be referred to as controllers, microcontrollers, microprocessors, or microcomputers. The processors 11 and 21 may be implemented by hardware, firmware, software, or a combination thereof. In a hardware configuration, application specific integrated circuits (ASICs), digital signal processors (DSPs), digital signal processing devices (DSPDs), programmable logic devices (PLDs), or field programmable gate arrays (FPGAs) may be included in the processors 11 and 21. Meanwhile, if the present invention is implemented using firmware or software, the firmware or software may be configured to include modules, procedures, functions, etc. performing the functions or operations of the present invention. Firmware or software configured to perform the present invention may be included in the processors 11 and 21 or stored in the memories 12 and 22 so as to be driven by the processors 11 and 21.

The processor 11 of the transmitting device 10 performs predetermined coding and modulation for a signal and/or data scheduled to be transmitted to the outside by the processor 11 or a scheduler connected with the processor 11, and then transfers the coded and modulated data to the transceiver 13. For example, the processor 11 converts a data stream to be transmitted into K layers through demultiplexing, channel coding, scrambling, and modulation. The coded data stream is also referred to as a codeword and is equivalent to a transport block which is a data block provided by a MAC layer. One transport block (TB) is coded into one codeword and each codeword is transmitted to the receiving device in the form of one or more layers. For frequency up-conversion, the transceiver 13 may include an oscillator. The transceiver 13 may include $N_t$ (where $N_t$ is a positive integer) transmit antennas.

A signal processing process of the receiving device 20 is the reverse of the signal processing process of the transmitting device 10. Under control of the processor 21, the transceiver 23 of the receiving device 20 receives radio signals transmitted by the transmitting device 10. The transceiver 23 may include $N_r$ (where $N_r$ is a positive integer) receive antennas and frequency down-converts each signal received through receive antennas into a baseband signal. The processor 21 decodes and demodulates the radio signals received through the receive antennas and restores data that the transmitting device 10 intended to transmit.

The transceivers 13 and 23 include one or more antennas. An antenna performs a function for transmitting signals processed by the transceivers 13 and 23 to the exterior or receiving radio signals from the exterior to transfer the radio signals to the transceivers 13 and 23. The antenna may also be called an antenna port. Each antenna may correspond to one physical antenna or may be configured by a combination of more than one physical antenna element. The signal transmitted from each antenna cannot be further deconstructed by the receiving device 20. An RS transmitted through a corresponding antenna defines an antenna from the view point of the receiving device 20 and enables the receiving device 20 to derive channel estimation for the antenna, irrespective of whether the channel represents a single radio channel from one physical antenna or a composite channel from a plurality of physical antenna elements including the antenna. That is, an antenna is defined such that a channel carrying a symbol of the antenna can be obtained from a channel carrying another symbol of the same antenna. A transceiver supporting a MIMO function of transmitting and receiving data using a plurality of antennas may be connected to two or more antennas.

The transmitting device 10 or the processor 11 thereof may be configured to include a Polar encoder according to the present invention. The receiving device 20 and the processor 21 thereof may be configured to a Polar decoder according to the present invention.

In a few scenarios, functions, procedures, and/or methods disclosed in this specification may be implemented by a processing chip. The processing chip may be called a system-on-chip (SoC) or a chipset. The processing chip may include a processor and a memory and may be mounted or installed in each of the communication devices 10 and 20. The processing chip may be configured to perform or control any one of the methods and examples disclosed in the present specification or such methods or examples may be performed by a communication device in or to which the processing chip is mounted/installed or connected. The transmitting device 10 and/or the receiving device 20 illustrated in FIG. 19 may be the communication device. The memory included in the processing chip may be configured to store software code or programs including indications causing the processor or the communication device to perform some or all of the functions, methods, and examples disclosed in the present specification when being executed by the processor or the communication device. The memory included in the processing chip may be configured to store or buffer information or data generated by the processor of the processing chip or information recovered or obtained by the processor of the processing chip. One or more processes involving transmission or reception of the information or the data may be performed by the processor or under control of the processor. For example, the processor may transmit a signal including information or data to a transceiver operably connected to or coupled to the processing chip or control the transceiver to transmit a radio signal including the information or data. The processor may be configured to receive a signal including information or data from the transceiver operably connected to or coupled to the processing chip and obtain the information or data from the signal.

For example, the processor 11 connected to or mounted in the transmitting device 10 may be configured to map specific bits of a PBCH to bit positions of a Polar code according to any one of the examples of the present invention. The processor 11 may encode the PBCH or control the Polar encoder to encode the PBCH, based on the Polar code. The processor 11 may be configured to transmit a signal (e.g., a baseband signal) including the PBCH to the transceiver 13 connected to the processor 11. The processor 11 may control the transceiver 13 to transmit a radio signal including the PBCH. The processor 21 connected to or mounted in the receiving device 20 may be configured to decode bits of the PBCH according to any one of the examples of the present invention. For example, the processor 21 may decode the PBCH using the Polar code or control the Polar decoder to decode the PBCH, based on a mapping relationship between specific bits of the PBCH and bit indexes of the Polar code. The processor 21 may control the transceiver 23 connected to the processor 21 to receive a radio signal including the PBCH. The processor 21 may control the transceiver 23 to down-convert the radio signal into a baseband signal. The processor 21 may receive a baseband signal including the PBCH from the transceiver 23.

The processor 11 connected to or mounted in the transmitting device may be configured to map information, which is to be transmitted through the PBCH based on a Polar sequence shared between the transmitting device and the receiving device, to bit positions of a Polar code of size N=512. The information may include half-frame information and a synchronization signal and PBCH block (SSB) index information. The half-frame information may be 1 bit and the SSB index information may be 3 bits. The processor 11 may be configured to map the half-frame information to bit position 247 among bit positions 0 to 511 of the Polar code and map the SSB index information to bit positions 253, 254, and 255 of the Polar code. The processor 11 may be configured to encode the information based on the Polar code. The processor 11 may include a Polar encoder configured to encode the information based on the Polar code. The processor 11 may transmit the PBCH including the encoded information to the transceiver 13. The transceiver 13 may transmit a radio signal including the PBCH on a cell under control of the processor 11. The processor 11 may configure a payload of the PBCH by a total of 56 bits. The information within the PBCH may include a system frame number of a frame in which the PBCH is transmitted. The processor 11 may be configured to map the second bit and third least significant bits (LSBs) of the system frame number to bit positions 441 and 469 of the Polar code, respectively. The processor 11 may be configured to the other 8 bits of the system frame number to bit positions 367, 375, 415, 444, 470, 473, 483 and 485 of the Polar code, respectively.

The transceiver 23 of the receiving device receives the radio signal including the PBCH on the cell. The processor 23 connected to or mounted in the receiving device may be configured to decode, based on the Polar code of size N=512, the information within the PBCH based on the Polar sequence shared between the transmitting device and the receiving device. The processor 23 may include a Polar decoder configured to decode the information within the PBCH based on the Polar code of size N=512. The processor 23 or the Polar decoder may be configured to decode the information based on a mapping relationship between the information and bit positions of the Polar code. The information may include half-frame information and synchronization signal and PBCH block (SSB) index information. The half-frame information may be 1 bit and the SSB index information may be 3 bits. The mapping relationship may include: mapping the half-frame information to bit position 247 among bit positions 0 to 511 of the Polar code and mapping the SSB index information to bit positions 253, 254, and 255 of the Polar code. The processor 23 may be configured to obtain the PBCH payload of a total of 56 bits from a signal of the PBCH. The information within the PBCH may include a system frame number of a frame in which the PBCH is transmitted. The mapping relationship may further include: mapping the second and third least significant bits (LSBs) of the system frame number to bit positions 441 and 469 of the Polar code, respectively. The mapping relationship may further include: mapping the other 8 bits of the system frame number to bit positions 367, 375, 415, 444, 470, 473, 483 and 485 of the Polar code, respectively. The processor 23 may obtain the system frame number by decoding a signal received on a PBCH resource based on the mapping relationship.

The Polar sequence may be a sequence arranging bit indexes 0 to 511 corresponding one by one to bit positions 0 to 511 of the Polar code in ascending order of reliability.

As described above, the detailed description of the preferred implementation examples of the present invention has been given to enable those skilled in the art to implement and practice the invention. Although the invention has been described with reference to exemplary examples, those skilled in the art will appreciate that various modifications and variations can be made in the present invention without departing from the spirit or scope of the invention described in the appended claims. Accordingly, the invention should not be limited to the specific examples described herein, but should be accorded the broadest scope consistent with the principles and novel features disclosed herein.

INDUSTRIAL APPLICABILITY

Examples of the present invention may be used for a processing chip connected to or mounted in a BS, a UE, or a communication device in a wireless communication system, or for other equipment.

The invention claimed is:

1. A method of transmitting a physical broadcast channel (PBCH) by a transmitting device in a wireless communication system, the method comprising:
    mapping information for the PBCH to input bit positions of a Polar code of size N=512, based on a Polar sequence;
    encoding the information based on the Polar code; and
    transmitting the PBCH including the information encoded based on the Polar code,
    wherein the information for the PBCH includes (i) half-frame information and (ii) synchronization signal and PBCH block (SSB) index information,
    wherein the half-frame information is 1 bit and is mapped to input bit position 247 among input bit positions 0 to 511 of the Polar code based on the Polar sequence, and
    wherein the SSB index information is 3 bits and is mapped to input bit positions 253, 254, and 255 among the input bit positions 0 to 511 of the Polar code based on the Polar sequence.

2. The method according to claim 1, wherein a total payload size of the PBCH including the information is 56 bits.

3. The method according to claim 1, wherein the Polar sequence includes a sequence with bit indexes 0 to 511 that arranges the input bit positions 0 to 511 of the Polar code in ascending order of reliability.

4. The method according to claim 1, wherein the information for the PBCH includes a system frame number (SFN) for a frame to which the PBCH belongs, and
    wherein mapping the information for the PBCH to input bit positions of the Polar code further comprises mapping the second and third least significant bits of the SFN to input bit positions 441 and 469 of the Polar code, respectively, and mapping the other 8 bits of the SFN to input bit positions 367, 375, 415, 444, 470, 473, 483 and 485 of the Polar code.

5. A method of receiving a physical broadcast channel (PBCH) by a receiving device in a wireless communication system, the method comprising:
    receiving the PBCH; and
    decoding information within the PBCH based on a Polar code of size N=512,
    wherein the information within the PBCH is decoded based on a mapping relationship between the information and input bit positions of the Polar code,
    wherein the information within the PBCH includes (i) half-frame information and (ii) synchronization signal and PBCH block (SSB) index information,
    wherein the half-frame information is one bit, and the SSB index information is 3 bits, and
    wherein the mapping relationship includes: mapping the half-frame information to input bit position 247 among input bit positions 0 to 511 of the Polar code, and mapping the SSB index information to input bit positions 253, 254, and 255 among the input bit positions 0 to 511 of the Polar code.

6. The method according to claim 5, wherein a total payload size of the PBCH including the information is 56 bits.

7. The method according to claim 5, wherein the Polar sequence includes a sequence with bit indexes 0 to 511 that arranges the input bit positions 0 to 511 of the Polar code in ascending order of reliability.

8. The method according to claim 5, wherein the information within the PBCH includes a system frame number (SFN) for a frame to which the PBCH belongs, and
    wherein the mapping relationship further includes: mapping the second and third least significant bits of the SFN to input bit positions 441 and 469 of the Polar code, respectively, and mapping the other 8 bits of the SFN to bit positions 367, 375, 415, 444, 470, 473, 483 and 485 of the Polar code.

9. A transmitting device configured to transmit a physical broadcast channel (PBCH) in a wireless communication system, the transmitting device comprising,
a transceiver;
at least one processor; and
at least one computer memory operably connectable to the at least one processor and storing instructions that, when executed by the at least one processor, perform operations comprising:
mapping information for the PBCH to input bit positions of a Polar code of size N=512, based on a Polar sequence;
encoding the information based on the Polar code; and
transmitting, through the transceiver, the PBCH including the information encoded based on the Polar code,
wherein the information for the PBCH includes (i) half-frame information and (ii) synchronization signal and PBCH block (SSB) index information,
wherein the half-frame information is one bit and is mapped to input bit position 247 among bit positions 0 to 511 of the Polar code, and
wherein the SSB index information is 3 bits and is mapped to input bit positions 253, 254, and 255 of the Polar code.

10. The transmitting device according to claim 9, wherein a total payload size of the PBCH including the information is 56 bits.

11. The transmitting device according to claim 9, wherein the Polar sequence includes a sequence with bit indexes 0 to 511 that arranges the input bit positions 0 to 511 of the Polar code in ascending order of reliability.

12. The transmitting device according to claim 9, wherein the information includes a system frame number (SNF) for a frame to which the PBCH belongs, and
wherein mapping the information for the PBCH to input bit positions of the Polar code further comprises mapping the second and third least significant bits of the SFN to input bit positions 441 and 469 of the Polar code, respectively, and mapping the other 8 bits of the SFN to bit positions 367, 375, 415, 444, 470, 473, 483 and 485 of the Polar code.

13. A receiving device configured to receive a physical broadcast channel (PBCH) in a wireless communication system, the receiving device comprising,
a transceiver;
at least one processor; and
at least one computer operably connectable to the at least one processor and storing instructions that, when executed by the at least one processor, perform operations comprising:
receiving, through the transceiver, the PBCH; and
decoding information within the PBCH based on a Polar code of size N=512,
wherein the information within the PBCH is decoded based on a mapping relationship between the information and input bit positions of the Polar code,
wherein the information within the PBCH includes (i) half-frame information and (ii) synchronization signal and PBCH block (SSB) index information,
wherein the half-frame information is one bit, and the SSB index information is 3 bits, and
wherein the mapping relationship includes: mapping the half-frame information to input bit position 247 among bit positions 0 to 511 of the Polar code, and mapping the SSB index information to input bit positions 253, 254, and 255 among the input bit positions 0 to 511 of the Polar code.

14. The receiving device according to claim 13, wherein a total payload size of the PBCH including the information is 56 bits.

15. The receiving device according to claim 13, wherein the information within the PBCH includes a system frame number (SFN) for a frame to which the PBCH belongs, and
wherein the mapping relationship further includes: mapping the second and third least significant bits of the SFN to bit positions 441 and 469 of the Polar code, respectively, and mapping the other 8 bits of the SFN to bit positions 367, 375, 415, 444, 470, 473, 483 and 485 of the Polar code.

* * * * *